(12) United States Patent
Mayfield

(10) Patent No.: US 6,833,803 B2
(45) Date of Patent: Dec. 21, 2004

(54) METHODS AND APPARATUS FOR ANALOG-TO-DIGITAL CONVERSION

(75) Inventor: Glenn A. Mayfield, West Lafayette, IN (US)

(73) Assignee: Radian Research, Inc., Lafayette, IN (US)

( * ) Notice: Subject to any disclaimer, the term of this patent is extended or adjusted under 35 U.S.C. 154(b) by 17 days.

(21) Appl. No.: 10/380,396

(22) PCT Filed: Sep. 11, 2001

(86) PCT No.: PCT/US01/42103
§ 371 (c)(1),
(2), (4) Date: Mar. 12, 2003

(87) PCT Pub. No.: WO02/23729
PCT Pub. Date: Mar. 21, 2002

(65) Prior Publication Data
US 2003/0174083 A1 Sep. 18, 2003

Related U.S. Application Data

(60) Provisional application No. 60/233,188, filed on Sep. 15, 2000.

(51) Int. Cl.[7] .................................................. H03M 1/12
(52) U.S. Cl. .................................... 341/155; 341/172
(58) Field of Search ........................... 341/155, 172, 341/161, 122, 166, 163, 164

(56) References Cited

U.S. PATENT DOCUMENTS

| | | | |
|---|---|---|---|
| 4,063,236 A | 12/1977 | Amemiya et al. | 341/129 |
| 4,229,730 A | 10/1980 | Huntington | 341/128 |
| 4,918,311 A * | 4/1990 | Rogers | 250/343 |
| 5,012,247 A * | 4/1991 | Dillman | 341/172 |
| 5,027,116 A | 6/1991 | Armstrong et al. | 341/120 |
| 5,148,171 A * | 9/1992 | Blumberg | 341/168 |
| 5,262,780 A | 11/1993 | Gray | 341/166 |
| 5,321,403 A | 6/1994 | Eng, Jr. et al. | 341/168 |
| 5,621,406 A | 4/1997 | Goetzinger et al. | 341/120 |
| 5,745,060 A | 4/1998 | McCartney et al. | 341/120 |
| 5,841,310 A | 11/1998 | Kalthoff et al. | 327/337 |
| 6,377,200 B1 * | 4/2002 | Lee | 341/155 |

FOREIGN PATENT DOCUMENTS

WO  WO 00/31876  6/2000  ............ H03M/1/10

* cited by examiner

*Primary Examiner*—Peguy JeanPierre
(74) *Attorney, Agent, or Firm*—Barnes & Thornburg

(57) ABSTRACT

A method and apparatus for analog-to-digital (A/D) converting an input signal having a first polarity include providing an integrator including a capacitance coupled to an input port of an amplifier, coupling an A/D converter to an output port of the amplifier, changing the amount of charge stored in the capacitance by coupling the input signal and a reference source having a second and opposite polarity to the capacitance, and controlling an A/D conversion cycle of the A/D converter to simultaneously charge and discharge the capacitance with the input signal and the reference source prior to each A/D conversion cycle. Another method and apparatus for (A/D) converting an input signal include providing an integrator including a capacitance coupled to an input port of an amplifier, coupling an A/D converter to an output port of the amplifier, changing the amount of charge stored in the capacitance at a known time rate by alternately coupling the input signal and a reference source to the capacitance through at least one switch, and controlling an A/D conversion cycle of the A/D converter and the at least one switch for controlling the coupling of the input signal and the reference source to the capacitance.

80 Claims, 5 Drawing Sheets

METHODS AND APPARATUS FOR ANALOG-TO-DIGITAL CONVERSION

CROSS-REFERENCE TO RELATED APPLICATIONS

This application is a U.S. national counterpart application of international application Ser. no. PCT/US01/42103 filed Sep. 11, 2001 which claims priority to U.S. provisional application Ser. No. 60/233,188 filed Sep. 15, 2000.

FIELD OF THE INVENTION

This invention relates to analog-to-digital converters. It is disclosed in the context of analog-to-digital converters for use in power measuring instruments. However, it is believed to be useful in other applications as well.

BACKGROUND OF THE INVENTION

There are many variations on analog-to-digital (hereinafter sometimes A/D) conversion techniques Most implementations can be placed in one of six categories. These are successive approximation, flash, voltage-to-frequency, dual slope, charge balancing, and delta-sigma.

Successive approximation converters generally employ a sample-and-hold circuit, a comparator, a digital-to-analog converter and some control logic. The input signal is first captured by the sample-and-hold circuit and then a search pattern is executed using the digital-to-analog converter and the comparator. For optimization of speed, the search pattern is usually a binomial type. The input signal is scaled to be somewhere within the range of the output of the digital-to-analog converter. In the binomial search pattern the digital-to-analog converter is set to half scale and the comparator is used to determine if the captured input signal is higher or lower than the output of the digital-to-analog converter. This eliminates half of the possible results and thus determines the most significant bit of the conversion. The digital-to-analog converter is then reset to bisect the remaining voltage range and the comparator is again used to determine in which half the input voltage resides. This determines the next most significant bit. The process is repeated until the number of bits required is achieved. A twelve-bit converter requires twelve such comparisons.

Flash converters make use of a divider ladder, multiple comparators and decode logic to perform the A/D conversion. There are as many comparators and taps on the divider ladder as there are codes in the A/D converter. An 8-bit converter requires 256 comparators and 256 taps on the divider. A 12-bit converter, if produced, would require a staggering 4096. The comparators then compare the incoming signal against their respective tap voltages. Comparators with tap voltages above the input voltage assume a first state. Those with tap voltages below the input voltage assume a second state. The outputs of all the comparators are fed into the decode logic to create the output. Because they perform all the comparisons at one time, flash converters are generally considered the fastest of these six kinds of A/D converters.

Dual slope converters are a form of integrating converter. They work by measuring charge accumulated in a capacitor. If not already a current, the input signal is converted to a current and applied to a discharged capacitor for a fixed period of time. An operational amplifier, hereinafter op-amp, -based integrator circuit is frequently used to provide an extremely low burden to the input current source. Since current multiplied by time is charge and the charging time is fixed, the charge that is placed in the capacitor is proportional to the average input current. As the charge is applied, the voltage of the capacitor ramps up. This is the first slope to which the name dual slope converter refers. Next, the second step of measuring this charge is conducted. To measure the charge accumulated, the charging process is ended, and a calibrated discharging current is applied. The time required to return the capacitor to the discharged state is measured. As the charge is removed, the voltage across the capacitor ramps back down to zero. When the capacitor voltage returns to zero, exactly the amount of charge which resulted from the input current has been removed. This is the second slope to which the dual slope name refers. Since the discharge current applied and the time it was applied are both known, the charge that was removed from the capacitor, and therefore the charge that accumulated in the capacitor resulting from the input signal, is also known. If this charge is then divided by the time required for the input current to charge it, the average input current for the measurement period is calculated.

A charge balance converter is another form of integrating converter. Charge balance converters are similar to dual slope converters, in that the input signal to a charge balance converter is a current or is converted to a current, and the charge being accumulated in a capacitor is measured. They differ primarily in how charge is measured and removed. In a charge balance converter, charge continuously accumulates in the capacitor, while being simultaneously being removed in discrete quanta. Periodically, the voltage across the capacitor is measured. If enough charge has accumulated, a packet of charge is removed. This is usually accomplished by applying a calibrated current for a specific period of time. For each sample period when a packet of charge is removed, a pulse is output by the converter. If no charge is removed during the sample period, no pulse is output. The pulses, when present, appear at periodic boundaries. The frequency of the pulses is then measured to complete the conversion.

A voltage-to-frequency converter is another form of integrating converter. Voltage-to-frequency converters are similar to dual slope and charge balance converters in that the input is a current, or is converted from a voltage to a current and the charge accumulated in the capacitor is measured. They differ from dual slope- and charge balance converters in how the charge is removed. As in charge balance converters, in voltage-to-frequency converters charge is removed in discrete quanta. Unlike charge balance converters, voltage-to-frequency converters remove the charge whenever a full quantum or packet of charge has accumulated. Thus, in voltage-to-frequency converters, charge is not removed on periodic boundaries. This causes the converter to provide an output frequency which is proportional to the applied input current. The National Semiconductor LM131 family of voltage-to-frequency converters is a good example of this type of A/D converter.

The delta-sigma converter is yet another form of integrating converter. Delta-sigma converters are a highly specialized form of the charge balance converter, but are discussed separately here. The delta-sigma converter can be considered as two components, a modulator and a digital filter. The modulator contains the converter's integrating portion and charge removal portion. The modulator effectively functions as a very high speed, 1 bit digitizer with a very unique noise spectrum. This 1 bit digitizer samples at a frequency that is several orders of magnitude higher than the frequency band of interest. Because of its unique construction, the noise spectrum it produces is non-uniformly distributed and the bulk of the noise energy is outside of the frequency band of interest. Thus, by proper filtering much of this noise can be removed. This is one function served by the digital filter. The modulator is interesting in that it can perform the voltage-to-current conversion as an inherent part of its function, and thus, from the user's perspective, the input to the converter is usually a voltage instead of a current. The digital filter performs two functions. It functions as a very sophisticated version of the counter in the charge balance converter, as well as a digital filter to extract a higher resolution result at a lower data rate than the 1 bit digitizer.

Traditional power measurement has principally revolved around measuring power flow in power delivery circuits. The measurements, whether they are watts, watt-hours, VoltAmpereSReactive (VARS), Q-hours, or the like, have usually been measured one at a time. Performing these measurements involves the precision multiplication of a voltage signal and a current signal. Traditionally this has been performed with analog circuitry. The most commercially successful of these circuits has been the pulse width modulator. In communications circuitry, it is often referred to as a balanced mixer or ring demodulator. In any case, the function is identical.

In a typical pulse width modulator, the first of the two signals controls a circuit which chops the polarity of the second signal in a pulse width-controlled manner, depending upon the amplitude of the first signal. The output of the circuit is a series of harmonics which are multiples of the frequencies of the two signals and a DC component which is proportional to the coincidence of the two signals. The output is low pass filtered to eliminate everything except the DC component and then converted into a digital signal.

A drawback of a pulse width modulator is that it can only produce one measurement at a time. The multiplication occurs in the modulator itself. Power consumers are now beginning to demand simultaneous measurement of multiple parameters. Power consumers are also asking for power suppliers to measure more parameters. Consumers are now asking for information on the harmonics of the power signal. They want to know such information from the fundamental out to the fiftieth harmonic for both 50 and 60 Hz systems. This means that accurate measurements must be performed all the way from 45 Hz to 3 KHz. At the fundamental frequency, customer accuracy expectations require better than 0.01% (100 PartsPerMillion) and grow only to 0.1% (1000 PPM) by the fiftieth harmonic. One good way of meeting these needs is to digitize the voltage and current waveforms and perform the mathematical operations on the digitized data stream.

Because power is being measured with extreme accuracy and wide bandwidth requirements, significant demands are imposed on the analog-to-digital converters used to digitize the voltage and current waveforms. Sampling rates must be quite high. Since accurate measurements must be made out to 3 KHz, at least at 6K samples per second must be taken. Ideally, samples should be taken at least an order of magnitude more frequently to make the anti-aliasing filter easier to implement. Lower sampling rates are possible, but this increases the difficulty of implementing an anti-aliasing filter with negligible phase shift at the frequencies of interest.

The required gain accuracy is also quite high. In order to achieve a worst-case system accuracy, the rule of thumb is that all subsystems of the instrument must typically be performing at least an order of magnitude better. This means that at 60 Hz, the A/D converter needs to have an accuracy of 0.001% (10 PPM). To achieve this level of accuracy, an A/D converter needs a minimum effective resolution of at least 17 bits (log(100,000)/log(2)=16.6≈17). Because power factors down to about 0.5 will need to be measured, an additional bit will need to-be measured to maintain the dynamic range. Thus, 18 bits will need to be measured. Because it is also expected that the A/D converter will operate with input signals at half of full scale, another bit of resolution will be required. This increases the requirement to 19 bits. Since most commercially available A/D converters perform at a much lower effective resolution than their number of bits would imply, an A/D converter resolution of from 20 to 22 bits is a realistic requirement.

Further, since two separate signals are to be multiplied together, phase accuracy or knowing exactly when in time a waveform's sample was taken relative to the other waveform's sample needs to be known. At 60 Hz and a power factor of 0.5 (60 degrees), an error in time between the two signals of only 153 nanoseconds (nsec) causes a 0.01% (100 PPM) error in the calculated result. When operating at 3 KHz at 0.5 power factor, a 30.6 nsec error in time between the two signals causes a 0.1% (1000 PPM) error in the calculated result. These errors consume the entire error budgets for the system. In order to comply with the order of magnitude rule for any individual component, time error needs to be controlled to within 3 nsec for 3 KHz signals and 15.3 nsec for 60 Hz signals.

The combined speed and resolution requirements almost immediately eliminate all the current, commercially available, successive approximation, flash, and dual slope A/D converters. Most remaining commercially available, high-speed, high-resolution A/D converters have been designed with audio conversion in mind. Absolutely flat frequency response between 45 Hz and 3 KHz is not uppermost among design criteria for audio A/D converters. A passband with 0.1 dB ripple is quite acceptable from an audio point of view. Unfortunately it would cause up to 11,579 PPM of error in this application. Many audio A/ID converters also have built-in filters to reject 50 and 60 Hz signals. Finally, audio A/D converters generally make no effort to synchronize channels to the nanosecond level. There is no practical requirement to do so in audio applications.

DISCLOSURE OF THE INVENTION

According to one aspect of the invention, a circuit for analog-to-digital (A/D) conversion of an input signal includes an integrator. The integrator includes a capacitance and an amplifier. The capacitance is coupled to an input port of the amplifier. The circuit further includes an A/D converter coupled to an output port of the amplifier, a reference source for changing the amount of charge stored in the capacitance at a known time rate, and at least one switch for alternately coupling the reference source and the input signal to the capacitance. The circuit further includes a processor for controlling an A/D conversion cycle of the A/D converter and for controlling the coupling of the input signal and the reference source to the capacitance.

Illustratively according to this aspect of the invention, the processor includes a processor for summing outputs from the A/D converter during successive cycles and dividing by the number of summed outputs to increase the resolution of the A/D converter output.

Further illustratively according to this aspect of the invention, the processor includes a processor for summing outputs from two consecutive cycles and dividing by two.

Additionally illustratively according to this aspect of the invention, the processor includes a processor for summing outputs from four consecutive cycles and dividing by four.

Illustratively according to this aspect of the invention, the amplifier includes multiple amplifiers in cascade configuration to increase the gain of the amplifier cascade.

Further illustratively according to this aspect of the invention, the multiple amplifiers include multiple video amplifiers.

Additionally illustratively according to this aspect of the invention, the processor controls the at least first switch to provide a known charge to the integrator, and controls the A/D converter to A/D convert the integrator output before and after the introduction of the charge.

Further illustratively according to this aspect of the invention, the circuit includes a time base generator coupled to the processor. The processor periodically operates the at least first switch to uncouple the input signal from the integrator periodically, to couple the reference source to the integrator periodically, and to provide a known charge to the integrator periodically. The A/D converter A/D converts the integrator output before and after the periodic introduction of the charge.

Illustratively according to this aspect of the invention, the processor determines from the A/D converted integrator output before and after the introduction of the charge the effective capacitance of the integrator and A/D converter combination.

Additionally illustratively according to this aspect of the invention, the integrator including a capacitance and an amplifier includes a first integrator including a first capacitance and a first amplifier and a second integrator including a second capacitance and a second amplifier. The first and second capacitances are so oriented in the apparatus that their temperatures remain substantially the same during operation of the apparatus. The processor determines from the A/D converted first integrator output before and after the introduction of the charge the effective capacitance of the first integrator and A/D converter combination and concludes that changes in the effective capacitance of the second integrator are comparable.

Illustratively according to this aspect of the invention, the temperature coefficient of the capacitance is known. The processor determines from the change in the effective capacitance of the capacitance and the temperature coefficient of the capacitance the temperature of the capacitance.

Further illustratively according to this aspect of the invention, the reference source includes a first reference source and a second reference source. The at least first switch includes at least a first switch for selectively uncoupling the input signal from the integrator and coupling the first reference source to the integrator and at least a second switch for selectively coupling the second reference source to the integrator. The processor controls the at least first switch to provide a first charge to the integrator, controls the A/D converter to A/D convert the integrator output after the introduction of the first charge, controls the at least second switch to remove a second charge calculated to be equal to the first charge, and controls the A/D converter to A/D convert the integrator output after the removal of the second charge to provide an offset voltage of the integrator and the A/D converter.

Additionally illustratively according to this aspect of the invention, the at least first switch selectively uncouples the input signal from the integrator and discharges the integrator. The processor controls the A/D converter to A/D convert the integrator output after the integrator is discharged, and calculates the amplifier bias current from the output of the A/D converter after the integrator has been discharged.

Further illustratively according to this aspect of the invention, the circuit includes a time base generator coupled to the processor. The processor controls the A/D converter to A/D convert the integrator output after the integrator capacitor is charged to determine leakage from the integrator capacitor.

Illustratively according to this aspect of the invention, the processor controls the at least first switch for providing a known charge to the integrator. The processor also controls the A/D converter to A/D convert the integrator output before and after the introduction of the charge. The processor includes a table of values to compensate the A/D converted integrator output by the difference between the A/D converted integrator output and the known charge.

Further illustratively according to this aspect of the invention, the processor operates the at least first switch a lesser number of times to charge the capacitance to a calculated value. The A/D converter then A/D converting a first output of the integrator. The processor then operates the at least first switch a greater number of times to charge the capacitance to the calculated value. The A/D converter then A/D converts a second output of the integrator. The processor then determines a difference between the A/D converted first output and the A/D converted second output, divides the difference between the A/D converted first output and the A/D converted second output by the difference between the greater number and the lesser number, and stores the quotient as a charge injection parameter.

Additionally illustratively according to this aspect of the invention, the processor operates the at least first switch once to charge the capacitance to the calculated value.

Illustratively according to this aspect of the invention, the greater number of times is at least one hundred times the lesser number of times.

Further illustratively according to this aspect of the invention, the reference source includes a first reference source for changing the amount of charge stored in the capacitance at a first known time rate and a second reference source for changing the amount of charge stored in the capacitance at a second known time rate. The at least a first switch selectively couples the first reference source to the integrator to charge the capacitance a first known amount and uncouples the second reference source from the integrator, and selectively uncouples the first reference source from the integrator and couples the second reference source to the integrator to charge the capacitance a second known amount. The processor compares the first and second known amounts to calibrate the second reference source to the first reference source.

Illustratively according to this aspect of the invention, the integrator is a first integrator including a first capacitance and a first amplifier. The first capacitance is coupled to an input port of the first amplifier. The A/D converter is a first A/D converter. The circuit further includes a second integrator including a second capacitance and a second amplifier. The second capacitance is coupled to an input port of the second amplifier. The circuit further includes a second A/D converter. The at least one switch selectively couples the reference source to the first integrator of to the second integrator. The processor controls the position of the at least first switch, controls a first A/D conversion cycle of the first A/D converter to produce a first A/D converter output, and controls a second A/D conversion cycle of the second A/D converter to produce a second A/D converter output.

Further illustratively according to this aspect of the invention, the input signal is an input current signal and the reference source includes a current reference source.

Additionally illustratively according to this aspect of the invention, the input signal is an input voltage signal. The circuit further includes a second amplifier and a resistance for converting the input voltage signal to an equivalent input current signal.

Illustratively according to this aspect of the invention, the reference source includes a first voltage reference source for changing the amount of charge stored in the capacitance at a first known time rate and a second voltage reference source for changing the amount of charge stored in the capacitance at a second known time rate. The at least first switch selectively couples the first voltage reference source to the integrator to charge the capacitance a first known amount and uncouples the second voltage reference source from the integrator, and uncouples the first voltage reference source from the integrator and couples the second voltage reference source to the integrator to charge the capacitance a second known amount.

Further illustratively according to this aspect of the invention, the second amplifier and resistance for converting the input voltage signal to an equivalent input current signal includes a second amplifier and first resistance for converting one of the input voltage signal, the first voltage reference source and the second voltage reference source to a first equivalent input current signal, and a third amplifier and second resistance for converting one of the input voltage signal, the first voltage reference source and the second voltage reference source to a second equivalent input current signal. The processor alternately couples said one of the input voltage signal, the first voltage reference source and the second voltage reference source through the second amplifier to produce a first A/D converter output and through the third amplifier to produce a second A/D converter output, and averages the first A/D converter output and the second A/D converter output.

Additionally illustratively according to this aspect of the invention, the first reference source has a first polarity, and the second reference source has a second and opposite polarity. Charging the capacitance a second known amount includes discharging the capacitance from the first known amount.

Illustratively according to this aspect of the invention, the at least first switch has a position in which no input signal is present. The processor stores A/D converter output when the at least first switch is in the position in which no input signal is present.

Further illustratively according to this aspect of the invention, the at least first switch includes a first switch for alternately coupling the reference source and the input signal to the second amplifier and a second switch for alternately coupling and uncoupling the second amplifier to the capacitance. The second switch is characterized by a second resistance. The circuit further includes a negative resistance device having a second resistance, the magnitude of which is substantially the magnitude of the first resistance, for coupling in circuit with the first resistance.

Further illustratively according to this aspect of the invention, the circuit includes a power supply for providing power for at least one of the integrator, the A/D converter, the reference source, the switch, and the processor. The power supply generates periodic signals during its operation. The processor synchronizes the A/D conversion cycle and the periodic signals so that the effect of the periodic signals on the A/D converter output is substantially constant.

According to another aspect of the invention, a circuit for A/D conversion of an input signal includes an integrator including an amplifier and a capacitance coupled to an input port of the amplifier. The circuit further includes an A/D converter coupled to an output port of the amplifier, a reference source for changing the amount of charge stored in the capacitance at a known time rate, and a processor for controlling an A/D conversion cycle of the A/D converter. The input signal has a first polarity, and the reference source has a second and opposite polarity. The capacitance is simultaneously charged and discharged by the input signal and the reference source prior to each A/D conversion cycle.

Further illustratively according to this aspect of the invention, the circuit includes at least one switch. The reference source includes a first reference source for changing the amount of charge stored in the capacitance at a first known time rate and a second reference source for changing the amount of charge stored in the capacitance at a second known time rate. The at least first switch selectively couples the first reference source to the integrator to change the amount of charge stored in the capacitance at the first known time rate, couples the second reference source to the integrator to change the amount of charge stored in the capacitance at the second known time rate, and couples both the first and second reference sources to the integrator to change the amount of charge stored in the capacitance at the algebraic sum of the first known time rate and the second known time rate.

Illustratively according to this aspect of the invention, the processor controls the at least one switch to couple the first reference source to the integrator, or to couple the second reference source to the integrator, or to couple both the first and second reference sources to the integrator based upon the A/D converter output during a preceding A/D conversion cycle.

Further illustratively according to this aspect of the invention, the processor adjusts the A/D converter output during an A/D conversion cycle by an amount related to the A/D converter output during at least one preceding A/D conversion cycle and the A/D converter output during at least one succeeding A/D conversion cycle.

Additionally illustratively according to this aspect of the invention, the processor adjusts the A/D converter output during an A/D conversion cycle by an amount related to the A/D converter output during at least the immediately preceding A/D conversion cycle and the A/D converter output during at least the immediately succeeding A/D conversion cycle.

Illustratively according to this aspect of the invention, the processor adjusts the A/D converter output during an A/D conversion cycle by an amount related to the A/D converter output during at least the two immediately preceding A/D conversion cycles and the A/D converter output during at least the two immediately succeeding A/D conversion cycles.

According to yet another aspect of the invention, a method for analog-to-digital (A/D) conversion of an input signal includes providing an integrator including a capacitance coupled to an input port of an amplifier, coupling an A/D converter to an output port of the amplifier, changing the amount of charge stored in the capacitance at a known time rate by alternately coupling the input signal and a reference source to the capacitance through at least one switch, and controlling an A/D conversion cycle of the A/D converter and the at least one switch for controlling the coupling of the input signal and the reference source to the capacitance with a processor.

Further illustratively according to this aspect of the invention, the method includes summing outputs from the A/D converter during successive cycles and dividing by the number of summed outputs to increase the resolution of the A/D converter output.

Illustratively according to this aspect of the invention, summing outputs from the A/D converter during successive cycles and dividing by the number of summed outputs includes summing outputs from two consecutive cycles and dividing by two.

Additionally illustratively according to this aspect of the invention, summing outputs from the A/D converter during successive cycles and dividing by the number of summed outputs includes summing outputs from four consecutive readings and dividing by four.

Illustratively according to this aspect of the invention, providing an integrator including a capacitance coupled to an input port of an amplifier includes providing multiple amplifiers in cascade configuration to increase the gain of the amplifier cascade.

Further illustratively according to this aspect of the invention, providing multiple amplifiers includes providing multiple video amplifiers.

Additionally illustratively according to this aspect of the invention, providing an integrator including a capacitance coupled to an input port of an amplifier includes providing a video amplifier.

Illustratively according to this aspect of the invention, controlling the at least first switch includes controlling the at least first switch to provide a known charge to the integrator, and controlling the A/D conversion cycle includes controlling the A/D conversion cycle to A/D convert the integrator output before and after the introduction of the charge.

Further illustratively according to this aspect of the invention, the method includes periodically operating the at least first switch to uncouple the input signal from the integrator and couple the reference source to the integrator to provide a known charge to the integrator. Coupling an A/D converter to the integrator output includes A/D converting the integrator output before and after the periodic introduction of the charge.

Additionally illustratively according to this aspect of the invention, controlling an A/D conversion cycle of the A/D converter and the at least one switch for controlling the coupling of the input signal and the reference source to the capacitance with a processor includes determining from the A/D converted integrator output before and after the introduction of the charge the effective capacitance of the integrator and A/D converter combination.

Illustratively according to this aspect of the invention, providing an integrator including a capacitance coupled to an input port of an amplifier includes providing a first integrator including a first capacitance coupled to an input port of a first amplifier and providing a second integrator including a second amplifier and a second capacitance coupled to an input port of the second amplifier, the second capacitance so oriented its temperature remains substantially the same as the temperature of the first capacitance during performance of the method. Determining from the A/D converted integrator output before and after the introduction of the charge the effective capacitance of the integrator and A/D converter combination includes determining from the A/D converted first integrator output before and after the introduction of the charge the effective capacitance of the first integrator and A/D converter combination, and concluding that changes in the effective capacitance of the second integrator are comparable.

Further illustratively according to this aspect of the invention, providing an integrator including a capacitance includes providing a capacitance, the temperature coefficient of which is known. The method further includes determining from the change in the effective capacitance of the capacitance and the temperature coefficient of the capacitance the temperature of the capacitance.

Additionally illustratively according to this aspect of the invention, alternately coupling the reference source to the capacitance through at least a first switch includes alternately coupling a first reference source through at least a first switch for selectively uncoupling the input signal from the integrator and coupling the first reference source to the integrator and alternately coupling a second reference source through at least a second switch for selectively coupling the second reference source to the integrator, controlling the at least first switch for providing a first charge to the integrator, controlling the A/D converter to A/D convert the integrator output after the introduction of the first charge, controlling the at least second switch for removing a second charge calculated to be equal to the first charge, and controlling the A/D converter to A/D convert the integrator output after the removal of the second charge to provide an offset voltage of the integrator and the A/D converter.

Illustratively according to this aspect of the invention, alternately coupling the input signal and the reference source to the capacitance through at least one switch includes selectively uncoupling the input signal from the integrator and discharging the integrator. Controlling an A/D conversion cycle of the A/D converter and the at least one switch for controlling the coupling of the input signal and the reference source to the capacitance with a processor includes controlling the A/D converter to A/D convert the integrator output after the integrator is discharged and calculating the amplifier bias current from the output of the A/D converter after the integrator has been discharged.

Further illustratively according to this aspect of the invention, the method includes controlling the A/D converter to A/D convert the integrator output after the integrator capacitor is charged to determine leakage from the integrator capacitor.

Additionally illustratively according to this aspect of the invention, the method includes controlling the at least first switch to provide a known charge to the integrator, controlling the A/D converter to A/D convert the integrator output before and after the introduction of the charge, and providing a table of values to compensate the A/D converted integrator output by the difference between the A/D converted integrator output and the known charge.

Illustratively according to this aspect of the invention, the method includes operating the at least first switch a lesser number of times to charge the capacitance to a calculated value and A/D converting a first output of the integrator, operating the at least first switch a greater number of times to charge the capacitance to the calculated value and A/D converting a second output of the integrator, determining a difference between the A/D converted first output and the A/D converted second output, dividing the difference between the A/D converted first output and the A/D converted second output by the difference between the greater number and the lesser number, and storing the quotient as a charge injection parameter.

Further illustratively according to this aspect of the invention, operating the at least first switch a lesser number of times to charge the capacitance to the calculated value includes operating the at least first switch once to charge the capacitance to the calculated value.

Additionally illustratively according to this aspect of the invention, the greater number of times is at least about one hundred times the lesser number of times.

Illustratively according to this aspect of the invention, coupling a reference source to the capacitance through at least one switch includes changing the amount of charge stored in the capacitance at a first known time rate by coupling a first reference source to the capacitance and changing the amount of charge stored in the capacitance at a second known time rate by coupling a second reference source to the capacitance. The at least a first switch selectively couples the first reference source to the integrator to charge the capacitance a first known amount and uncouples the second reference source from the integrator, and uncouples the first reference source from the integrator and couples the second reference source to the integrator to charge the capacitance a second known amount. The method further includes comparing the first and second known amounts to calibrate the second reference source to the first reference source.

Further illustratively according to this aspect of the invention, coupling a first reference source to the capacitance includes coupling a first reference source having a first polarity to the capacitance. Coupling a second reference source to the capacitance includes coupling a second reference source having a second and opposite polarity to the capacitance. Charging the capacitance a second known amount includes discharging the capacitance from the first known amount.

Additionally illustratively according to this aspect of the invention, providing an integrator including a capacitance coupled to an input port of an amplifier includes providing a first integrator including a first amplifier and a first capacitance coupled to an input port of the first amplifier, and providing a second integrator including a second amplifier and a second capacitance coupled to an input port of the second amplifier. Coupling an A/D converter to an output port of the amplifier includes coupling a first A/D converter to an output port of the first amplifier, coupling a second A/D converter to an output port of the second amplifier. Alternately coupling the input signal and a reference source to the capacitance through at least one switch includes selectively coupling the reference source to the first integrator or to the second integrator. Controlling an A/D conversion cycle of the A/D converter with the processor includes controlling a first A/D conversion cycle of the first A/D converter for producing a first A/D converter output and controlling a second A/D conversion cycle of the second A/D converter for producing a second A/D converter output.

Illustratively according to this aspect of the invention, the input signal is an input current signal. Alternately coupling the input current signal and a reference source to the capacitance includes alternately coupling the input current signal and a current reference source to the capacitance.

Further illustratively according to this aspect of the invention, the input signal is an input voltage signal. The method further includes providing a second amplifier and a first resistance for converting the input voltage signal to an equivalent input current signal.

Additionally illustratively according to this aspect of the invention, alternately coupling the input signal and a reference source to the capacitance through at least one switch includes alternately coupling a first voltage reference source for changing the amount of charge stored in the capacitance at a first known time rate and a second voltage reference source for changing the amount of charge stored in the capacitance at a second known time rate. The at least first switch selectively couples the first voltage reference source to the integrator to charge the capacitance a first known amount and uncouples the second voltage reference source from the integrator, and uncouples the first voltage reference source from the integrator and couples the second voltage reference source to the integrator to charge the capacitance a second known amount.

Illustratively according to this aspect of the invention, providing a second amplifier and a first resistance for converting the input voltage signal to an equivalent input current signal includes providing a second amplifier and first resistance for converting one of the input voltage signal, the first voltage reference source and the second voltage reference source to a first equivalent input current signal, and providing a third amplifier and second resistance for converting one of the input voltage signal, the first voltage reference source and the second voltage reference source to a second equivalent input current signal. Controlling an A/D conversion cycle of the A/D converter and the at least one switch for controlling the coupling of the input signal and the reference source to the capacitance includes alternately coupling said one of the input voltage signal, the first voltage reference source and the second voltage reference source alternately through the second amplifier to produce a first A/D converter output and through the third amplifier to produce a second A/D converter output. The method further includes averaging the first A/D converter output and the second A/D converter output.

Further illustratively according to this aspect of the invention, alternately coupling a first voltage reference source for changing the amount of charge stored in the capacitance at a first known time rate and a second voltage reference source for changing the amount of charge stored in the capacitance at a second known time rate includes alternately coupling a first voltage reference source having a first polarity for changing the amount of charge stored in the capacitance at a first known time rate and a second voltage reference source having a second polarity opposite to the first polarity for changing the amount of charge stored in the capacitance at a second known time rate.

Additionally illustratively according to this aspect of the invention, alternately coupling the input signal and a reference source to the capacitance through at least one switch includes alternately coupling the input signal, a reference source and no input to the capacitance. Controlling an A/D conversion cycle of the A/D converter and the at least one switch for controlling the coupling of the input signal and the reference source to the capacitance includes controlling an A/D conversion cycle of the A/D converter and the at least one switch for controlling the coupling of the input signal, the reference source and no input to the capacitance and storing A/D converter output when the at least first switch is in the position in which no input is present.

Illustratively according to this aspect of the invention, providing at least a first switch for alternately coupling the reference source and the input signal to the second amplifier includes providing at least a second switch for alternately coupling and uncoupling the second amplifier to the capacitance. The method further includes providing a negative resistance device having a second resistance, the magnitude of which is substantially the magnitude of the first resistance, for coupling in circuit with the first resistance.

Further illustratively according to this aspect of the invention, the method includes providing a power supply for at least one of the integrator, the A/D converter, the reference source, the switch, and the processor, which power supply generates periodic signals during its operation. Controlling an A/D conversion cycle of the A/D converter includes synchronizing the A/D conversion cycle and the periodic signals so that the effect of the periodic signals on the A/D converter output is substantially constant.

According to yet another aspect of the invention, a method of analog-to-digital (A/D) conversion of an input signal having a first polarity includes providing an integrator including a capacitance coupled to an input port of an amplifier, coupling an A/D converter to an output port of the amplifier, changing the amount of charge stored in the capacitance by coupling the input signal and a reference source having a second and opposite polarity to the capacitance, and controlling an A/D conversion cycle of the A/D converter to simultaneously charge and discharge the capacitance with the input signal and the reference source prior to each A/D conversion cycle.

Illustratively according to this aspect of the invention, changing the amount of charge stored in the capacitance by coupling the input signal and a reference source having a second and opposite polarity to the capacitance includes selectively coupling a first reference source for changing the amount of charge stored in the capacitance at a first known time rate to the integrator to change the amount of charge stored in the capacitance at the first known time rate, coupling a second reference source for changing the amount of charge stored in the capacitance at a second known time rate to the integrator to change the amount of charge stored in the capacitance at the second known time rate, and coupling both the first and second reference sources to the integrator to change the amount of charge stored in the capacitance at the algebraic sum of the first known time rate and the second known time rate.

Illustratively according to this aspect of the invention, selectively coupling the first reference source or the second reference source or both the first and second reference sources to the integrator includes controlling at least one switch to couple the first reference source to the integrator, or to couple the second reference source to the integrator, or to couple both the first and second reference sources to the integrator based upon the A/D converter output during a preceding A/D conversion cycle.

Further illustratively according to this aspect of the invention, controlling an A/D conversion cycle of the A/D converter includes adjusting the A/D converter output during an A/D conversion cycle by an amount related to the A/D converter output during at least one preceding A/D conversion cycle and the A/D converter output during at least one succeeding A/D conversion cycle.

Additionally illustratively according to this aspect of the invention, adjusting the A/D converter output during an A/D conversion cycle by an amount related to the A/D converter output during at least one preceding A/D conversion cycle and the A/D converter output during at least one succeeding A/D conversion cycle includes adjusting the A/D converter output during an A/D conversion cycle by an amount related to the A/D converter output during at least the immediately preceding A/D conversion cycle and the A/D converter output during at least the immediately succeeding A/D conversion cycle.

Illustratively according to this aspect of the invention, adjusting the A/D converter output during an A/D conversion cycle by an amount related to the A/D converter output during at least one preceding A/D conversion cycle and the A/D converter output during at least one succeeding A/D conversion cycle includes adjusting the A/D converter output during an A/D conversion cycle by an amount related to the A/D converter output during at least the two immediately preceding A/D conversion cycles and the A/D converter output during at least the two immediately succeeding A/D conversion cycles.

BRIEF DESCRIPTION OF THE DRAWINGS

The invention may best be understood by referring to the following detailed description and the accompanying drawings. In the drawings.

DETAILED DESCRIPTIONS OF ILLUSTRATIVE EMBODIMENTS

Figure 1:
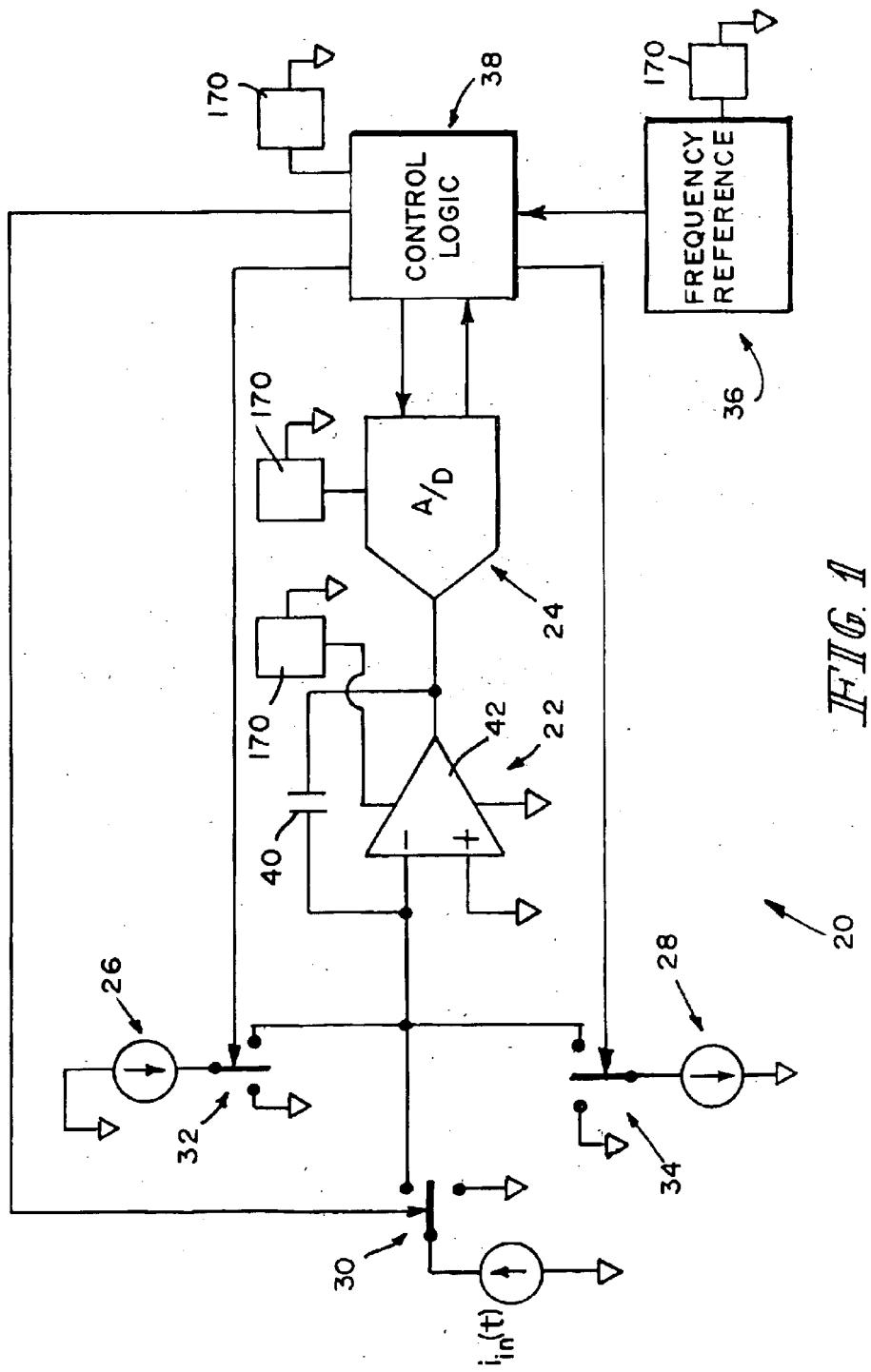
FIG. 1 illustrates a block diagram of an embodiment of an integrating A/D converter according to the invention.

FIG. 1 illustrates a block diagram of a relatively higher resolution, integrating A/D converter 20 according to the invention. The A/D converter 20 includes a precision integrator 22, a relatively lower resolution, higher speed A/D converter 24, two current references 26 and 28, three logic-controlled switches 30, 32 and 34, a frequency reference 36, and control logic 38, which may include, for example, an appropriately programmed single chip microcomputer ($\mu$C), Programmable Gate Array (PGA), Application-Specific Integrated Circuit (ASIC) or the like. As in most previous integrating converters, the input signal takes the form of a current $i_{in}(t)$. Charge is removed in a controlled fashion to perform the A/D conversion. This embodiment employs an integrator 22 and oversampling to improve upon the accuracy and linearity of a commercial A/D converter 24. For example, a 16-bit A/D converter 24 runs at 24 thousand samples (Ksamples) per second to digitize an incoming signal with a 3 KHz bandwidth. This results in an A/D converter 20 with at least 18 bits of effective resolution at 3 KHz and more than 20 bits of effective resolution at 60 Hz.

The converter 20 uses the high speed A/D converter 24 to measure the voltage across an integrating capacitor 40. Since the approximate size of the capacitor 40 and the voltage across it are known, the charge in the capacitor 40 can be calculated from Q=CV. The control logic 38 turns on a reference current from one of reference sources 26, 28 for the period of time calculated to remove this estimated amount of charge during the next A/D conversion cycle. If no additional charge is added from $i_{in}(t)$ during the next period, the voltage across the capacitor 40 will be reduced to zero. Only additional charge being added from the input during this next period can cause a voltage across the capacitor 40. That voltage would again be proportional to the charge that is added.

Achieving exactly zero volts on the integrating capacitor 40 at the end of an A/D conversion cycle relies upon certain assumptions. These assumptions include, for example, that the integrator 22's op-amp 42 has infinite gain and no offset or input bias current, the voltage measurement of the high speed A/D converter 24 is perfect, the exact value of the reference current sourced or sunk by reference source 26 or 28 (or both) is known, the amount of time the reference current is applied is known exactly, and the exact value of the capacitor 40 is known. Of course, these conditions are never completely achieved, but with the system illustrated in FIG. 1, they can be relatively precisely evaluated. Most parameters of the converter 20 can be quite accurately measured, permitting self-calibration of the converter 20. The only significant parameter of the converter 20 that cannot be calibrated is the error voltage at the input of the integrator 22 resulting from the op-amp 42's finite gain. Oversampling the incoming signal, combined with the fact that any error in the digitization is retained in the integrating capacitor 40 and is rolled over to the next A/D conversion cycle permits the A/D converter 20 to achieve improved accuracy. Therefore, perfection of measurement on a cycle-by-cycle basis is not required.

The error voltage at the input of the op-amp 42 in the integrator 22 comes from the finite gain of the op-amp 42 in the integrator 22, and it manifests itself as an error in the voltage that the high-speed A/D converter 24 reads for the capacitor 40 voltage. This can be appreciated from the following discussion. The output voltage of the op-amp 42 is the gain of the op-amp 42 times the input voltage. Conversely, the output voltage of the op-amp 42 divided by the gain is the voltage that appears across the input of the op-amp 42. If the output voltage of the op-amp 42 is 1 volt and the op-amp has a gain of 10, the voltage across the input terminals of the op-amp 42 is 0.1 volts. The voltage across the integrator capacitor 40 would be 1.1 volts, but the high-speed A/D converter 24 would only see the 1 V output of the op-amp 42. The error presented to the high-speed A/D converter 24 is proportional to the output current of the op-amp 42. Interestingly, the charge stored in the capacitor 40 of the integrator 22 is not affected by this error. Only the ability to estimate the charge stored in the capacitor 40 is affected. Any error in charge estimation is rolled over to the next measurement cycle. This gain error cannot be removed by calibration. Its effect can, however, be made arbitrarily small by two techniques. The first technique is to increase the gain of the op-amp 42. The second is to reduce the output impedance of the op-amp 42.

Increasing the gain of the op-amp 42 reduces the steady state signal at the input to the op-amp 42. As discussed earlier, this voltage is included as part of the signal that the high-speed A/D converter 24 measures as the integrator capacitor 40 voltage. If the gain of the op-amp 42 is greater than one million, the gain error created by the finite gain of the op-amp 42 is less than 1 part per million (1 PPM). While many commercial op-amps have gains greater than 1 million at DC and low frequency, none provide gains approaching 1 million at frequencies of 3 kHz. In order to achieve op-amp 42 gains greater than 1 million at 3 kHz, op-amps must be coupled in cascade configuration.

Minimizing the output impedance of the op-amp 42 helps reduce the transient settling time problems caused by switching DC current references into and out of an integrator 22 with finite gain. When the current reference 26 or 28 initially switches into the circuit 20, the current flowing into the output of the op-amp 42 abruptly changes. While the op-amp 42 may have high gain at 3 KHz it does not have high gain at the MHZ frequencies caused by switching the current source 26 or 28 into or out of the circuit 20. This causes a sudden transient voltage to appear at the output of the op-amp 42. This voltage is equal to the source 26 or 28 current being switched into the circuit 20 multiplied by the output impedance of the op-amp 42. The op-amp 42 immediately begins to react to bring this error back to zero volts but the results are not instantaneous. The recovery time is a function of the gain and phase margins of the op-amp 42 at the MHZ frequencies. To obtain the desired level of error, these transient responses need to have settled for many, many time constants. Of course, if the op-amp 42 had infinite gain at all frequencies, this transient problem would not exist. However, there are no infinite gain, infinite bandwidth op-amps. However, minimizing the output impedance of the op-amp 42 minimizes the transient input and thus the transient response. Op-amp 42 output impedance is typically on the order of 50 ohms. By using very wide bandwidth op-amps 42 in the output stage, such as modem voltage and current feedback op-amps 42 designed for video applications, as output stages, sub-milliohm output impedances can be achieved in the MHZ frequency range. This improves the settling time problem by several orders of magnitude.

The A/D converter 20 illustrated in FIG. 1 can be made to be largely self-calibrating. This is done using the current 26, 28 and frequency 36 references. Calibration can improve such parameters as capacitor 40 tolerance, leakage, and temperature drift; high-speed A/D converter 24 non-linearity, op-amp 42 gain accuracy, gain drift, and offset voltage; integrator 22 input offset voltage and input bias currents; and charge injection from the switches 30, 32, 34.

The problems of capacitor 40 tolerance and high-speed A/D converter 24 gain accuracy cannot be individually determined and eliminated with the configuration illustrated in FIG. 1. Their collective effects can, however, be determined and reduced with a single calibration factor. Since a reference 26 or 28 current and reference 36 frequency are known, the input current can be disconnected and a known amount of charge introduced into the integrator capacitor 40. By measuring the voltage seen by the high-speed A/D converter 24 before and after the introduction of the charge, the effective capacitance of the integrator capacitor 40 and high-speed A/D converter 24 combination can be determined. This eliminates capacitor 40 tolerance and A/D converter 24 gain uncertainties. Drift of the capacitance 40 value and the A/D converter 24 gain with time and temperature is reduced by performing this calibration periodically.

Over short times, temperature drift and the relatively high temperature coefficient of the polypropylene film in the integrator capacitor 40 presently being used are believed to combine to be the predominant cause of drift in the effective capacitance of the integrator 22. Because of the predominance of a single source of short-term error combined with the fact that the polypropylene capacitors 40 used in the integrator 22 tend to have temperature coefficients that track rather well, the amount of effort and hardware required to keep systems with multiple integrators 22 calibrated can be substantially reduced. Because practical A/D converter 20-based power meters require multiple integrators 22, this is of particular interest.

When the integrator capacitors 40 are physically close enough to share a common temperature environment, it can be assumed that short term shift was caused by temperature drift affecting the integrator capacitors 40. The effective capacitances of all the integrators 22 can be adjusted to compensate for the same temperature shift. The temperature coefficients of the capacitors 40 do not even need to be known, as long as the temperature coefficients are the same for all capacitors 40. This permits a reduction of the time spent calibrating the effective capacitances of multiple integrators 22 by permitting calibration of only one of the integrators 22 for most of the periodic updates, and only having to calibrate all the integrators 22 fully at less frequent intervals. The effect of this on the cost of power meters is twofold. First, since less processing is required for a given amount of information, the cost of such a power meter for a given performance is reduced. Second, if the temperature coefficients of the capacitors 40 are known, this calibration technique is effectively measuring ambient temperature shifts in the integrator capacitors' 40s' environment, thus eliminating the need for separate temperature sensing hardware to perform a temperature shift compensation.

As with capacitor 40 tolerance and high-speed A/D converter 24 gain accuracy, integrator 22 input offset voltage and high-speed A/D converter 24 offset voltage cannot be separated with the embodiment illustrated in FIG. 1. However, as with capacitor 40 tolerance and high-speed A/D converter 24 gain accuracy, integrator 22 input offset voltage and high-speed A/D converter 24 offset voltage can be eliminated together with a calibration cycle. In one cycle, the integrator capacitor 40 can be charged to contain an offset voltage equal to the offset of the integrator 22 op-amp 42 and the high-speed A/D converter 24's offset. With the input $i_{in}(t)$ open circuited, the high-speed A/D converter 24 measures the capacitor 40's voltage. The charge on the effective capacitance is estimated and removed. If there is an offset voltage either in the integrator 22 op-amp 42 or the A/D converter 24, the integrator capacitor 40 will not be discharged to zero volts. A residual charge will be left on the effective capacitance of the integrator 22 in an amount that sets the voltage on the capacitor 40 to be equal and opposite to this offset voltage. If the effective capacitance of the converter 20 has already been measured and used in calculating the charge to be removed, then the offset should be nearly perfectly removed. The very next reading of the high-speed A/D converter 24 should measure zero volts. If the effective capacitance has not already been measured, an error charge will also remain in the capacitor 40 because of the improper estimation of the amount of charge to be removed. This can be corrected by measuring the effective capacitance and then performing this calibration or by iteratively performing this calibration until an acceptable level of error is obtained.

Integrator 22 op-amp 42 input bias current is measured by discharging the integrator 22 to zero volts and then opening all the switches 30, 32, 34 providing current to the integrator 22 and measuring change in voltage as a function of time. Since the effective capacitance is already known, and I=C ($\Delta V/\Delta t$), the input bias current can be calculated. Once the input bias current is known, it effects can be mathematically removed from measurements. Input bias currents do affect effective capacitance measurements, but can be made a secondary effect by known circuit design techniques. By iteratively estimating first effective capacitance and then input bias current, and comparing them with previous results, any desired level of accuracy can be demonstrated.

The integrator 22's capacitor 40 leakage is measured by charging the integrator 22 to nearly a full-scale charge, opening all the switches 30, 32, 34 providing current to the integrator 22, and then measuring the change in voltage as a function of time. As with measuring the bias current, the current that discharged the integrator capacitor 40 can be calculated. After adjusting for the op-amp 42 bias current, the remaining current is the leakage current of the integrator capacitor 40. Knowing the voltage across the capacitor 40 and the current through it, the capacitor 40's leakage resistance can be calculated from Ohm's law and its effects compensated mathematically. Depending upon what integrator 22 voltages were used to make the input bias current and effective capacitance measurements, capacitor 40 leakage can have a secondary effect on these two measurements. Usually the capacitor 40 voltages used to make these two measurements are sufficiently low, and the leakage resistances of the capacitors 40 sufficiently high, that this effect becomes negligible for the input bias and effective capacitance measurements. In any case where these conditions are not met, the error can be eliminated by iteratively estimating effective capacitance, input bias current, and capacitor 40 leakage resistance, and then comparing them with previous results. By performing these estimations, any desired level of accuracy can be demonstrated. The purpose of measuring the leakage resistance is for the general A/D measurement case where the integrator voltage may become quite substantial.

The high-speed A/D converter 24's non-linearity can also be measured and corrected. Although computationally intensive, a correction table for the high-speed A/D converter 24 can be generated and stored in the control logic 38 or memory associated with the control logic 38. Since the effective capacitance is known, and the charge placed into the integrator 22 can be accurately controlled, the effective voltage that the high-speed A/D converter 24 should be seeing can be controlled. A linearization table of what code corresponds to what voltage can be created for the high-speed A/D converter 24. By this means, linearity of a charge balance device and speed of a successive approximation device are achieved simultaneously.

Charge injection of the switches 30, 32, 34 used to control the reference currents 26, 28 can also be measured and compensated mathematically. To measure the effect of charge injection of the switches 30, 32, 34, what are believed to be the same amounts of charge are introduced in two different ways, once with minimal charge injection and once with maximal charge injection. First, the desired charge is introduced using as few cycles of the switch 30, 32, 34 as possible, preferably one cycle. The change in voltage on the effective capacitance of the integrator 22 is then measured, and the change in charge is calculated. The integrator 22 is then reset to the original starting point, and what is believed to be the same amount of charge is introduced in the maximum number of cycles of the switch 30, 32 or 34. The number of switch 30, 32, 34 cycles can easily number in the thousands. The change in voltage on the effective capacitance of the integrator 22 is again measured, and the change in charge is determined. The difference in charge between these two measurements is caused by charge injection resulting from cycling the switch 30, 32 or 34. If this charge difference is then divided by the difference in the number of switch 30, 32 or 34 cycles that created the charge difference, the charge injection per switch 30, 32, 34 cycle is obtained. By knowing the charge injection per cycle of the switch 30, 32, 34, its effects can be compensated mathematically. Since charge injection of the switches 30, 32, 34 can affect the measurement of the effective capacitance, effective capacitance and charge injection may have to be measured iteratively to determine that effective capacitance and charge injection have been adequately measured.

Because the integrator 22 structure illustrated in FIG. 1 is capable of handling bipolar current input, it contains both positive 26 and negative 28 reference current sources. By taking advantage of this structure, a variation of the above charge injection calibration procedure can be introduced to reduce the time required for the measurement. By using both the positive and negative reference current sources 26, 28 at the same time, both the minimum and maximum charge injection can be introduced simultaneously. One current source 26 or 28 is turned on continuously to introduce a specific amount of charge. The other current source 28 or 26 is turned on and off repeatedly, to introduce a theoretically equal but opposite charge. Any resulting change in voltage on the effective capacitance represents the imbalance of charge caused by charge injection of the switch 32 or 34. Dividing this charge by the number of switch 32 or 34 transitions, the charge injection per switch 32 or 34 transition can be calculated. Since both the minimum and maximum charge injections occur simultaneously, the calibration time can be reduced by as much as 50%.

Another aspect of the A/D converter 20 illustrated in FIG. 1 is its ability to increase the effective resolution of the high-speed A/D converter 24 by integration and oversampling. Without this, all of the calibration information would simply have resulted in a very accurate A/D converter 20 with the same resolution as the high-speed A/D converter 24 at its core.

How integration and oversampling improve resolution can be explained as follows. Incoming current is stored in the integrator 22 as charge. This charge remains in the integrator 22 until it is removed by a timed reference current 26 or 28 or some combination of the two. When the high-speed A/D converter 24 makes its estimate of the charge in the capacitor 40, the limited resolution of the high-speed A/D converter 24 causes the estimate to be off by a small amount. Even if the high-speed A/D converter 24 is perfect, the error can be as large as one half of the least significant bit of the high-speed A/D converter 24. This is frequently referred to as quantization noise. The error in estimating the charge in the capacitor 40 causes an error to be made in the amount of charge removed from the capacitor 40. This error charge remains in the capacitor 40 and is added to or subtracted from the incoming charge of the next cycle. The next A/D conversion cycle of high-speed A/D converter 24 will thus be adjusted. If the two consecutive readings are averaged, the resulting average will be as if both readings had been correct to an extra bit. By performing this average of the two readings, an extra bit has effectively been added to the conversion, and the conversion rate has been halved. If four readings are averaged, two extra bits are obtained, but at one quarter of the conversion rate. As frequency is reduced, the conversion becomes increasingly accurate. This increase in resolution continues at the rate of 1 bit per octave of frequency reduction. By using integration and oversampling, a relatively larger amplitude error has effectively been traded for a relatively smaller phase error.

In theory, if this approach were reduced all the way to DC, amplitude accuracy would be limited only by the quality of the current and time references and the gain of the integrator 22 op-amp 42, thermal and noise considerations excepted. In practice, 24-bit performance has been achieved with commercially available, 16-bit high-speed A/D converters 24.

It is desirable to have only one precision current reference 26 or 28. FIG. 1 illustrates two current references 26, 28 in the A/D converter 20. It would be desirable if one of these references 26, 28 were a master current reference and the other were an approximately known current reference calibrated from the master. This embodiment can be implemented with the A/D converter 20 illustrated in FIG. 1. First, the precision current reference 26 or 28 charges the integrator 22. The change in voltage is then measured with the high-speed A/D converter 24, and the effective capacitance is determined. The integrator 22 is then discharged with the approximately known current source 28 or 26 for what is believed to be the same amount of charge. The change in voltage is then measured, again with the high-speed A/D converter 24. From this voltage measurement and the known effective capacitance, the charge actually removed can be determined. The ratio of the actual charge removed to the expected charge removed is the correction factor for the approximately known current source 28 or 26.

If more than one A/D converter 20 is required in a power meter, the converter 20 illustrated in FIG. 1 can be adapted to permit all the converters to be run from one precision current source. Both current sources 26 and 28 illustrated in FIG. 1 would then become approximately known current sources calibrated from the master, precision current source. Another switch can be added to each A/D converter 20 to permit the precision current source to be routed into that converter 20. Each of the approximately known current sources 26, 28 could then be calibrated in each of the A/D converters 20 by using the above-described method.

To discharge the integrator capacitor 40 to zero volts, the programmable timer 36 that controls the current sources 26, 28 would need to have infinite resolution. This, of course, is not practical. Typically, a current source 26, 28 is sized so that it can completely charge or discharge the integrator 22 in one A/D conversion cycle. To do this, a programmable timer 36 that has at least the same resolution as the high-speed A/D converter 24 is required, to be able to discharge the integrator capacitor 40 to within one-half of the least significant bit of the high-speed A/D converter 24. If the current source 26, 28 can charge or discharge the integrator capacitor 40 in less than the full cycle, the resolution of the programmable timer 36 needs to be even higher. Programmable timers 36 of this capacity place a considerable burden on the control logic 38. The only way to reduce the complexity of the programmable timer 36 is to charge and discharge to a lesser resolution. This causes charge to remain in the integrator 22 that will affect the next measurement. However, this does not pose a problem, since the exact amount of this residual charge is known. The control logic 38 can keep track of the residual charge, and add or subtract this amount from the next charge measurement. This permits the required resolution of the charge timer 36 to be reduced.

Figure 2:
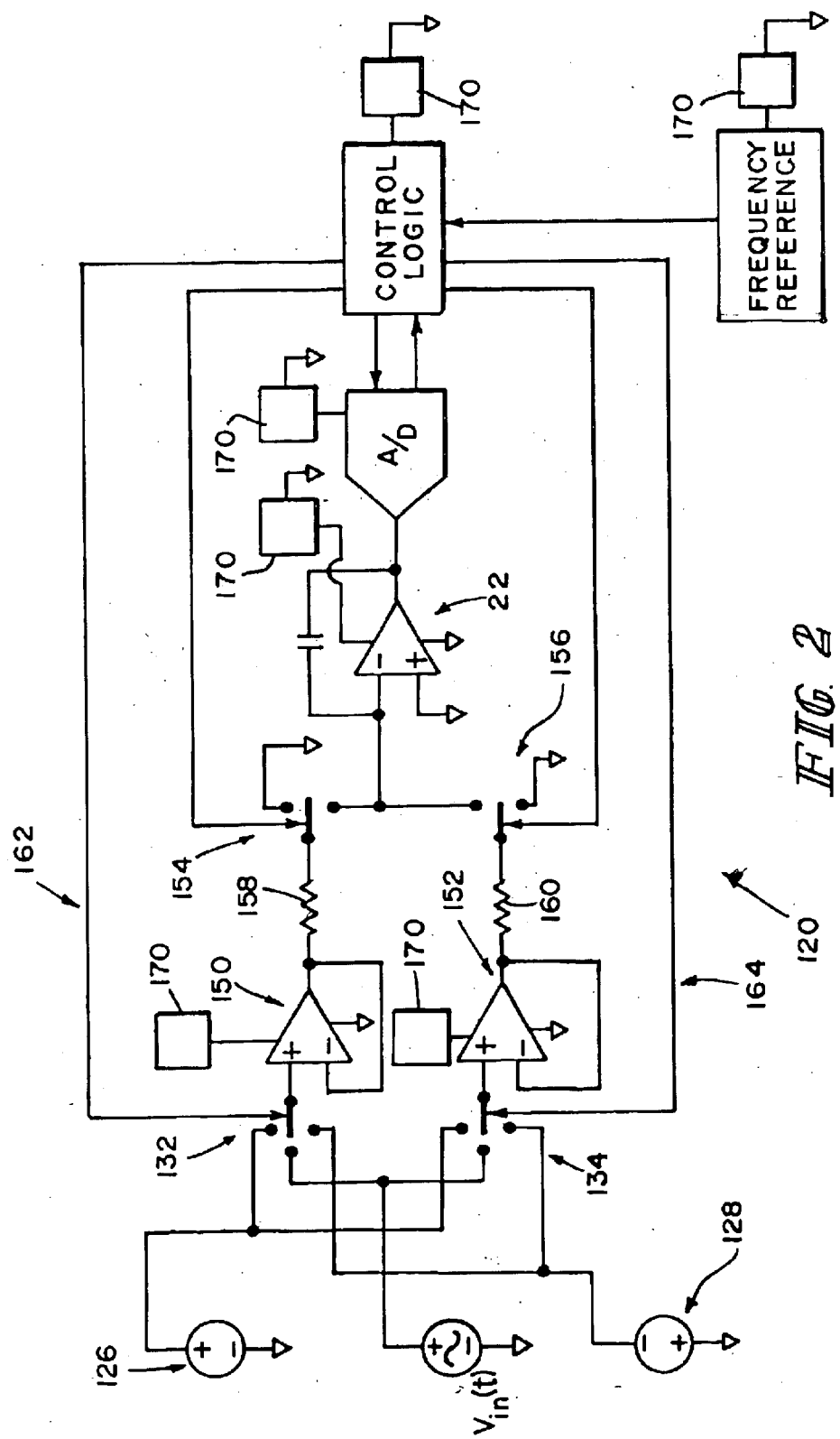
FIG. 2 illustrates a block diagram of an embodiment of another integrating A/D converter according to the invention.

The A/D converter 20 illustrated in FIG. 1 has current as its input and reference. FIG. 2 illustrates an embodiment having voltage input and voltage references 126, 128. There is very little difference between the embodiments illustrated in FIGS. 1 and 2. The input current and the two current references 26, 28 illustrated in FIG. 1 have been replaced by an input voltage and two voltage references 126, 128 in FIG. 2. The embodiment illustrated in FIG. 2 also includes two additional op-amps 150, 152, additional switches 154, 156 and two additional resistors 158, 160. For optimal performance, the two resistors 158, 160 are as nearly identical in value as the cost of the power meter will bear, and combine with the op-amps 150, 152, respectively, to form voltage $v_{in}(t)$, 126, 128-to-current converters 162, 164. Once the voltages are converted to currents, the A/D converter 120 illustrated in FIG. 2 performs as before. However, no matter how carefully the resistors 158, 160 are selected, a perfect match cannot be achieved using two separate resistors 158, 160 in voltage-to-current converters 162, 164. The gain of the input voltage will never exactly match the gain of the reference voltage 126, 128. This adds an error that cannot be removed by-self-calibration of the A/D converter 120. The additional switches 154, 156 are used to permit the gain of the voltage-to-current conversion to be controlled by the average value of resistors 158, 160. On every other cycle, the positions of resistors 158 and 160 in the circuit 120 are interchanged. This causes the current injected by the input voltage and input references 126, 128 to be these voltages divided by the average of the resistances of resistors 158, 160. The gains of the voltage-to-current conversion performed by both the voltage input and voltage references 126, 128 are now identical. The A/D converter 120 can thus be used for both current and voltage input.

The op-amps 150, 152 in the voltage-to-current converters 162, 164 illustrated in FIG. 2 are non-ideal and, as such, have input bias currents and input offset voltages. These bias currents and offset voltages can affect the conversion from a precision current reference 26, 28 to a precision voltage reference 126, 128. Precision voltage references 126, 128 typically have output voltages between 1 volt and 10 volts and output impedances significantly less than tens of milliohms. Op-amps 150, 152 typically have input offset voltages that range from single digit microvolts to tens of millivolts and input bias currents that range from hundreds of picoamperes to tens of microamperes.

The effect of bias current on the reference 126, 128 is easy to make negligible. The op-amp 150, 152 provides the bias to the negative input and is not a problem. However, at the positive input, assuming 100 milliohms of reference 126, 128 impedance, a 1 volt reference, and 100 microamperes of bias current, there is a 10 PPM ((100 milliohms ×100 microamperes)/1 V) effect on the conversion of voltage to current. By reasonably careful design, this concern can be overcome.

The major contributor to this error comes from the effect of input offset voltage. Even a very low input offset chopper op-amp, such as, for example, the Linear Technology LT1050 integrated circuit, has a maximum input offset voltage of 5 $\mu$V. For a 1 volt reference, this results in up to 5 PPM of error. This is a relatively high limiting condition for a precision converter 120. In addition to reducing error, it would be desirable to use op-amps 150, 152 with wider bandwidth and lower cost than chopper op-amps.

A minor modification illustrated in FIG. 2 can help resolve this problem. If each of switches 132 and 134 is provided with an additional terminal, and the additional terminals are coupled to ground, the positive input of the op-amp 150, 152 can now be switched to ground. With the input switched to ground, any output current is the result of the input offset voltage divided by the resistance performing the voltage-to-current conversion. If this current is directed to the integrator 22, the effect of the input offset voltage on the current produced can be measured and mathematically removed.

Figure 2A:
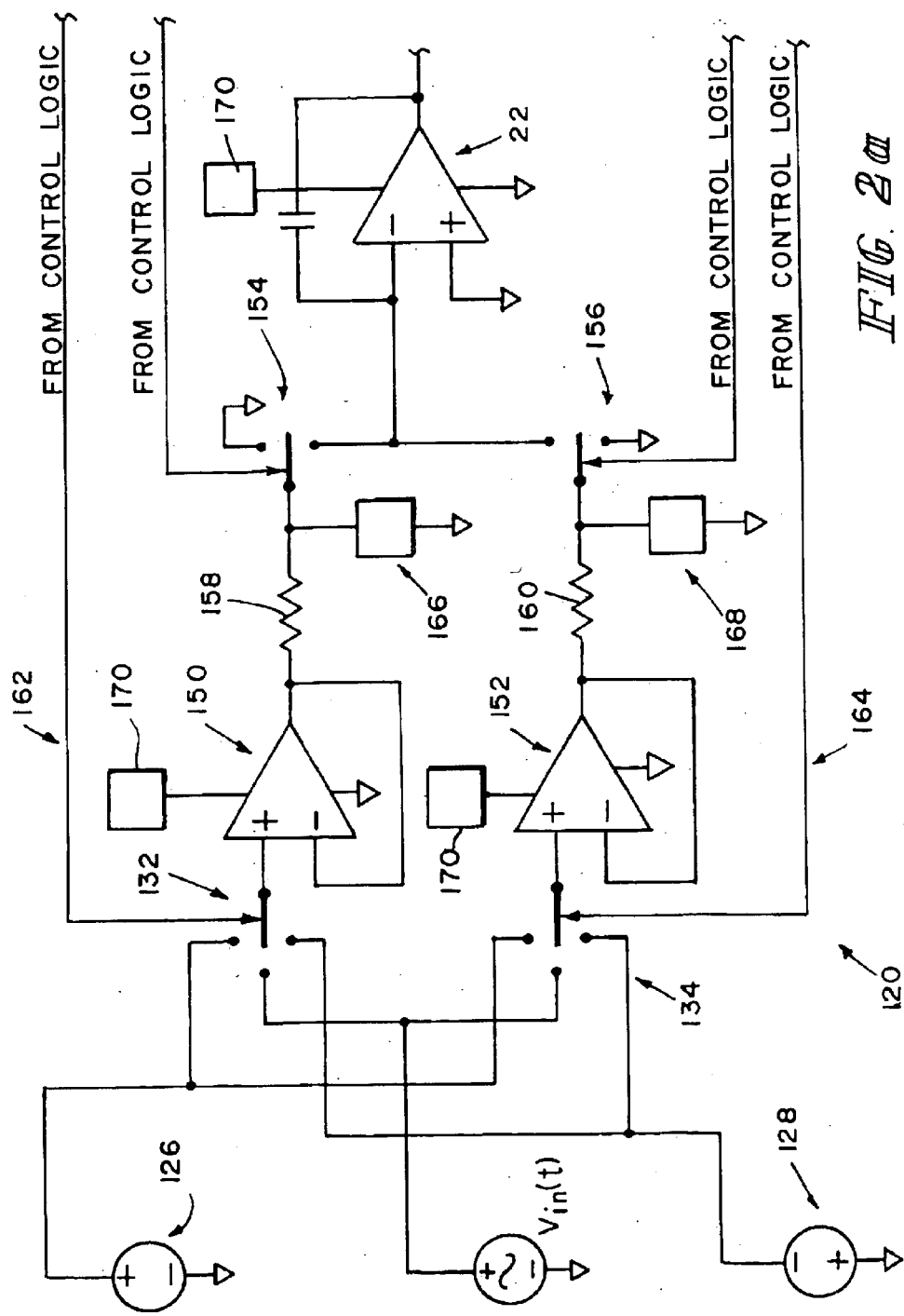
FIG. 2a illustrates a block diagram of an alternative detail to a detail illustrated in the embodiment of FIG. 2.

Whether they are mechanical or semiconductor switches, the switches 154, 156 used as part of the voltage-to-current converters 162, 164 have non-zero resistances, and may generate thermal EMF. This can affect the voltage-to-current conversion. Switches 132, 134 are relatively benign. The only current that flows through them is the bias current of the op-amp 150, 152. As was the case with the effect of bias current, careful choice of op-amps 150, 152 can make this effect negligible. Low thermal EMF switches 132, 134 can also be used to keep the power dissipation in the switches 132, 134 low, thereby keeping the thermal EMF negligible. The main area of concern is switches 154 and 156. Here, substantial current flow and relatively low resistance can have significant effects. The resistances of the switches 154 and 156 are in series with the voltage-to-current conversion resistors 158 and 160. The resistances of switches 154 and 156 thus become part of the voltage-to-current conversion. Any instability in switches 154 and 156 becomes an instability in the gain of the voltage-to-current conversion. There are numerous sources of switch 154, 156 instability. This problem can be solved by a modification to the circuit illustrated in FIGS. 2 and 2a. Negative resistors 166, 168 are coupled from the junction of resistor 158 and switch 154 to ground, and from the junction of resistor 160 and switch 156 to ground, respectively. Negative resistances 166, 168 can be implemented in any of a number of known ways. See, for example, Donald Christiansen, ed., the *Electronic Engineers' Handbook*, 4$^{th}$ edition, McGraw-Hill, New York, 1997, pp. 16.39–16.41. If the resistances of the negative resistances 166, 168 exactly equal the resistance of resistors 158 and 160, respectively, an ideal current source whose output current is the voltage input to the op-amp 150, 152 divided by the voltage-to-current converter resistor's 158, 160 value is the result. Having an ideal current source makes variations in the resistances of the switches 154, 156 irrelevant.

The following analysis of one of the two voltage-to-current converters 162, 164 demonstrates how the creation of a constant current source overcomes this problem. There are many well-known techniques for implementing negative resistance, and so a particular implementation of negative resistance will not be explored here. The output voltage V of the op-amp 150 is coupled to resistor 158. Because op-amp 150 has high gain and is configured as a unity gain buffer, the output impedance of the op-amp 150 is much less than the resistance of resistor 158, and can be ignored for purposes of analysis. Resistor 158 is coupled to the resistance $R_{sw}$ of switch 154. The other terminal of $R_{sw}$ is coupled to ground. The negative resistor 166 is coupled from the junction of resistor 158 and $R_{sw}$ to ground. Since these are linear circuits, the current that will flow into $R_{sw}$ can be determined by first finding the Thevenin equivalent voltage and resistance for the voltage V, the resistance of resistor 158 and the resistance of negative resistor 166. The Thevenin equivalent voltage, $V_T$, is equal to $V \times (R_{166}/(R_{158}+R_{166}))$. The Thevenin equivalent resistance, $R_T$, is equal to $(R_{158} \times R_{166})/(R_{158}+R_{166})$. Both $V_T$ and $R_T$ go to infinity for $R_{158}=-R_{166}$. This is what one would expect for a truly ideal current source. To find the actual value of the current source, this Thevenin equivalent circuit can be converted into a Norton equivalent circuit. The parallel resistance is, of course, the same as the series resistance on the Thevenin circuit, and is an infinite resistance. The current source, $I_N$, of the Norton equivalent is determined by dividing the Thevenin equivalent voltage by the Thevenin equivalent resistance, i.e. $I_N=V_T/R_T=(V \times (R_{166}/(R_{158}+R_{166})))/((R_{158} \times R_{166})/(R_{158}+R_{166}))$. Simplifying this equation, $I_N=V \times (R_{166}/(R_{158} \times R_{166}))=V/R_{158}$. This yields a Norton equivalent circuit that is a perfect current source whose output current is $V/R_{158}$.

Of course, the positive 158, 160 and negative 166, 168 resistors' values cannot practically be matched exactly, so a perfect current source is not attainable. However, a substantially improved current source can be achieved over the approximation with voltage V and resistor 158 only. By evaluating the actual Thevenin equivalent voltage and resistance available with mismatched resistors 158, 160 and 166, 168, a determination can be made how much the performance of the circuit has been improved. If the positive and negative resistances are matched to 0.1%, the Thevenin equivalent voltage and resistance are improved by a factor of 1000. This means that the circuit is 1000 times less sensitive to variations in resistance caused by the switch 154, 156. This is a substantial improvement.

In order to implement the A/D converters 20, 120 of FIGS. 1 and 2, one or more power supplies 170 are required. Many such power supplies 170 are of the switching type and, unless adequate measures are taken to prevent it, tend to inject their switching noise into the A/D converter 20, 120. Minimizing noise from these sources can be a significant undertaking. A solution other than eliminating the noise is to immunize the A/D converter 20, 120 against the effects of the noise. One way of achieving this end is to synchronize the frequencies of the switching supplies 170 with the conversion cycle of the A/D converter 20, 120. The effect of this synchronization is to cause the A/D converter 20, 120 to receive the same noise each cycle. Because the injected noise is the same each cycle, its effect is to create a DC offset in the A/D converter 20, 120. As was discussed earlier, a stable DC offset is easily removed by a calibration cycle.

As previously noted, random noise is presently the limiting factor in resolution. Two well-known ways to improve signal-to-noise ratios are to reduce the amount of noise present, and to increase the amount of signal present. Here the approach of increasing the amount of signal present is explored.

Let it be assumed that the A/D converter 20, 120 is set up so that, given a continuous maximum current from the input signal, neither the voltage limits of the integrator 22 nor the voltage limits of the high-speed A/D converter 24 are exceeded. The integrator capacitor 40 can be discharged back to zero volts between cycles. If the size of the input current is increased without changing the size of the integrator capacitor 40, the effective signal-to-noise ratio of the A/D converter 20, 120 is increased. However, without changing some other parameter, the additional charge from the increased input signal could exceed the voltage range of the integrator 22 or the high-speed A/D converter 24. Increasing the size of the integrator capacitor 40 would solve this problem, but would restore the original signal-to-noise ratio. However, because the incoming signal is being oversampled, and is bandwidth-limited, this problem can be resolved by using multiple reference current sources 26, 28. By transferring calibration from a single master, as many current sources as are needed can be provided.

Multiple current sources 26, 28 can be employed to remove charge from the converter dynamically, slightly faster than it is being added by the input signal. Because the input signal is being oversampled and bandwidth limited, how much current will be entering the integrator 22 during a cycle can be approximated based upon the previous cycle. Since the input signal is bandwidth limited, the rate at which it is charging the integrator 22 can only change by a finite amount with each cycle. Because how much charge was added during the last cycle is known, the rate at which charge is being added is known. Because the bandwidth of the incoming signal is limited, how much this rate of charge accumulation can be changed up or down is limited. How much charge minimally must be removed can thus be predicted, and removal of this charge can begin while this charge is being added by the input.

At the same time any charge that needs to be removed as a result of the last measurement may be removed. The only charge that the integrator 22 must be able to accommodate is the charge that resulted from the change in rate of charging. This means that the input can be run at a higher current without overrunning the integrator 22 or high-speed A/D converter 24. All that is needed is to have enough current sources 26, 28 running to balance the expected input current. The integrator capacitor 40 need be no larger than the size needed to accommodate the portion of the incoming current that cannot be predicted.

An additional benefit of reducing the size of the capacitor 40 relative to the input current is a reduction in the effects of dielectric storage of the integrator capacitor 40. The amount of charge captured by dielectric and not measured, compared to the amount of charge measured, is improved.

The problem of charge injection resulting from turning on multiple current sources 26, 28 at one time can also be avoided. Consideration of current history an additional cycle back in time permits a decision to be made which current sources 26, 28 must be turned off or on for the next cycle. This permits current sources 26, 28 to avoid being switched off or on as the converter 20, 120 progresses from cycle to cycle. This minimizes charge injection resulting from the operation of the switches 30, 32, 34, 132, 134, 154, 156.

While integrating analog converters 20, 120 possess many desirable characteristics, such as superb linearity and excellent signal-to-noise ratios, they do have certain limitations. One of these is that the process of integrating the input signal induces frequency-dependent amplitude and phase shifts in the incoming current. This affects the data obtained from the converter 20, 120. This frequency dependent amplitude and phase shift must be minimized to use the data stream coming from the converter 20, 120 properly. One way of minimizing the distortion would be to know exactly the gain of the integrator 22 and to calculate the exact amplitude and phase shifts for each harmonic. The incoming data stream could be Fourier transformed to determine the amplitude and phase of each harmonic. Each harmonic's amplitude and phase could then be adjusted for the effect of the integrator 22. Because the integrator 22 has already been calibrated, its gain is known, so this approach could be implemented. However, this is a computationally intensive method of achieving the desired results, and adds considerably to the cost and power consumption of a digital signal processor of the type which can be included in control logic 38 used in the calculations.

Another solution to the problem is to create a filter for the data stream that has the inverse amplitude and frequency response to the shifts that are caused by the integrator 22 and to filter the incoming data stream through this inverse filter. While this is possible, creating such an inverse filter is not trivial.

Figure 3:
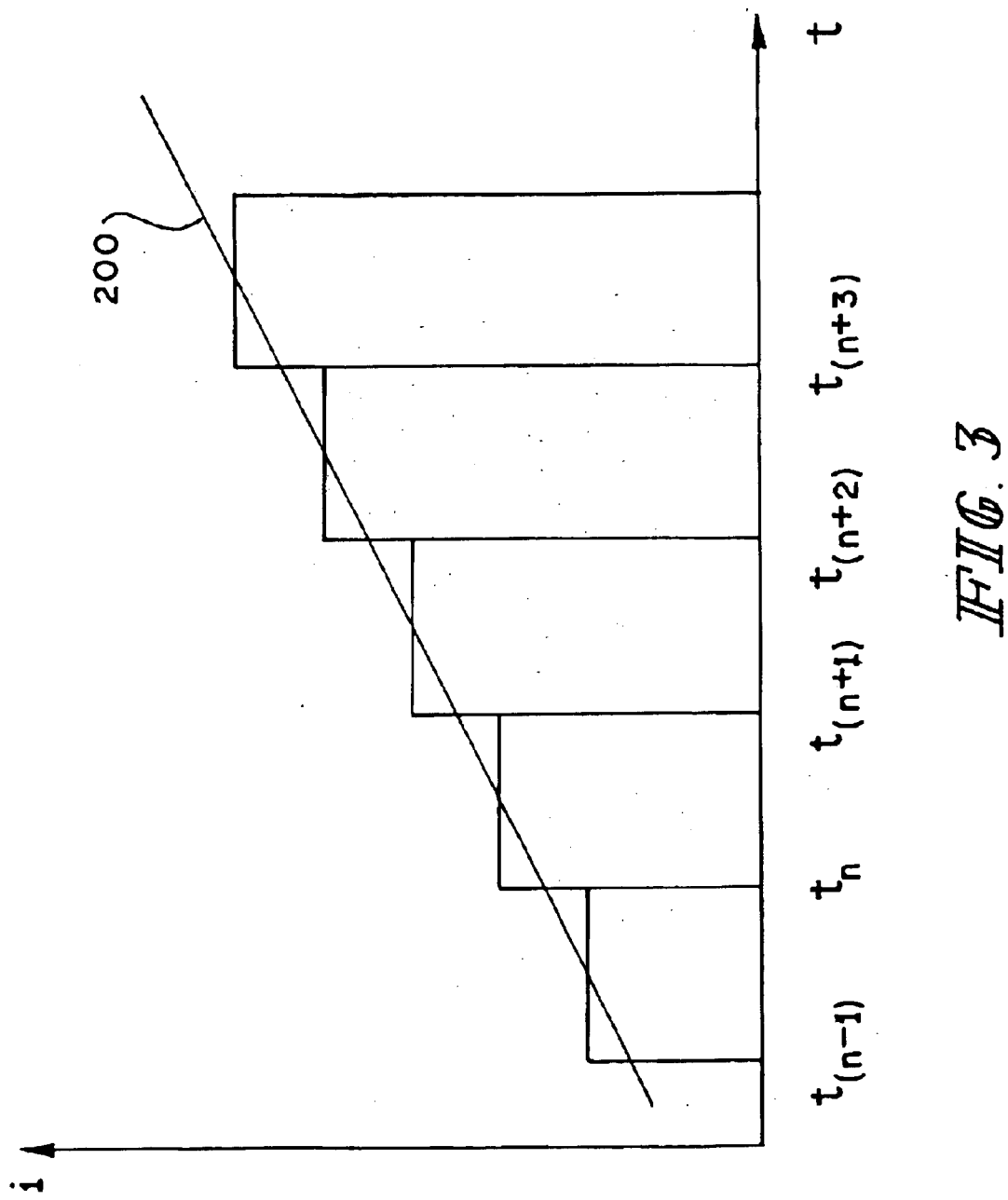
FIG. 3 illustrates a waveform useful in understanding the invention.

Another solution is to approach the correction of the data stream from a curve-fitting perspective. Investigation of several forms of error aids in the development of strategies for eliminating these errors. One source of phase error is the time shift that occurs due to integration. This time shift can be appreciated with reference to FIG. 3. FIG. 3 illustrates the incoming signal current, I, as a function of time, t, as an increasing ramp 200. The actual digitized data is illustrated as a series of rectangles where $t_{(n-1)}$, $t_n$, $t_{(n+1)}$, $t_{(n+2)}$, and so on, are the times at the end of each conversion cycle. The height of each rectangle is the average of the value of the input current 200 during the time of conversion. Because the input signal 200 is a ramp, the actual value obtained during each conversion exactly matches the value of the input signal at the midpoint between the samples. A phase shift of exactly half a conversion cycle has thus effectively been introduced into the measurement. That half cycle phase shift appears as a linear phase shift in the data stream. This solution is exact only for linear ramps 200 and becomes increasingly inaccurate as the input signal deviates from a ramp. However, the input is bandwidth-limited, and is being oversampled. Consequently, all of the input signals look substantially like ramps during the timeframe of adjacent samples. Because of this, when the digitized data is adjusted for this one-half cycle of shift, a substantial portion of the phase shift that occurs in the integrator 22 is eliminated.

Figure 4:
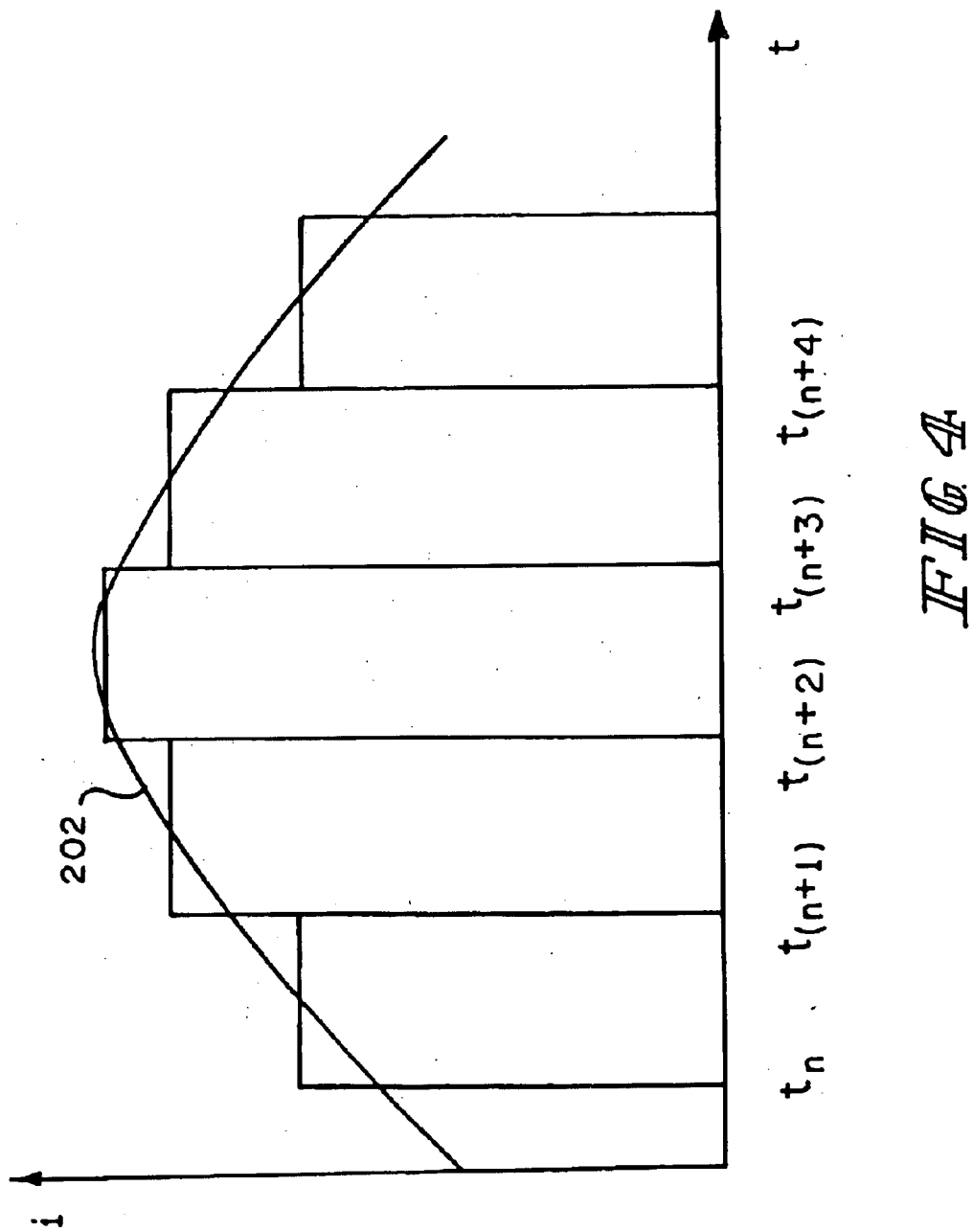
FIG. 4 illustrates another waveform useful in understanding the invention.

The inputs are not perfect ramps. There is some additional amplitude error that can be removed from the individual sample by accommodating the mild curve that does occur. FIG. 4 illustrates input current as a smooth curve 202 and the digitized output of the converter 20, 120 as a series of rectangles. The curve 202 is somewhat exaggerated to facilitate understanding. When the input is rising or falling, the conditions approximate the original ramp 200 conditions. However, looking at the curve 202 between samples $t_{(n+2)}$ and $t_{(n+3)}$, it can be seen that, when the curve 202 is at its peak, a new error occurs. The average value of the integrator 22 does not approximate the mean value of the sample as closely. This condition exists whether the curve is positive or negative. A solution to this problem is to adjust the height of any given result based upon the results of the preceding and succeeding measurements. For any given sample value $i_x$ which occurs at time $t_x$, its result is adjusted by the values for samples $I_{(x-1)}$ and $I_{(x+1)}$ which occur at times $t_{(x-1)}$ and $t_{(x+1)}$, respectively. The formula for the adjusted point at time $t_x$ is $i_x = i_x + [\{i_x - (I_{(x-1)} + I_{(x+1)})/2\} \times A_1]$, where $A_1$ is an experimentally determined coefficient. As can be seen from the formula, if both adjacent points are below the present point, as would be the case for the negative-going curve 202 of FIG. 4, a small amount of correction based on the difference between the current point and the adjacent points will be added to the current point. A similar adjustment occurs for positive-going curves. If the input is a ramp 200, no adjustment occurs, since the average of the preceding and succeeding points is identical to the present point.

To enhance the adjustment even further, the next more remote points from the present point can be taken into consideration. In this case, the formula for the adjusted point would be $i_x = i_x + [\{i_x - (I_{(x-1)} + I_{(x+1)})/2\} \times A_1] + [\{i_x - (I_{(x-2)} + I_{(x+2)})/2\} \times A_2]$, where $A_2$ is another experimentally determined coefficient.

Although tending to yield diminishing results in the oversampled and bandwidth-limited case, this approach can be extended as many orders as is necessary to achieve the desired results. Currently, only these two orders of adjustment are being investigated, and experimentally derived (determined by numerical simulation) coefficients for the formula are $A_1 = 0.125$ and $A_2 = -0.01046$.

The advantages of this approach to correcting for the distortion caused by the integrator 22 are the simplicity of the implementation of the algorithm in a modem digital signal processor, such as can be included in control logic 38, and the ease of determination of the coefficients. With this correction algorithm, an A/D converter 20, 120 has been implemented that has the noise and linearity performance of an integrating converter combined with the instantaneous data capability of a sample-and-hold converter.

In a further refinement, the half sample phase shift and height adjustment of the sample can be combined in one equation. This can be expressed as $I_{(x+0.5)} = \{(I_x + I_{(x+1)}) \times B_1\} + \{(I_{(x-1)} + I_{(x+2)} - i_x - I_{(x+1)}) \times B_2\} + \{(I_{(x-2)} + I_{(x+3)} - I_{(x+1)} - i_x) \times B_3\}$ where $B_1 = 0.5$, $B_2 = -0.103807$, and $B_3 = 0.013866$. As before the coefficients were determined by numerical simulation.

What is claimed is:

1. A circuit for analog-to-digital (A/D) conversion of an input signal, the circuit including an integrator, the integrator including a capacitance and an amplifier, the capacitance coupled to an input port of the amplifier, an A/D converter coupled to an output port of the amplifier, a reference source for changing an amount of charge stored in the capacitance at a known time rate, at least one switch for alternately coupling the reference source and the input signal to the capacitance, and a processor for controlling an A/D conversion cycle of the A/D converter and for controlling the coupling of the input signal and the reference source to the capacitance.

2. The apparatus of claim 1 wherein the processor includes a processor for summing outputs from the A/D converter during successive cycles and dividing a sum of the outputs from the A/D converter by the number of summed outputs.

3. The apparatus of claim 2 wherein the processor includes a processor for summing outputs from two consecutive cycles and dividing by two.

4. The apparatus of claim 2 wherein the processor includes a processor for summing outputs from four consecutive cycles and dividing by four.

5. The apparatus of claim 1 wherein the amplifier includes multiple amplifiers in cascade configuration.

6. The apparatus of claim 5 wherein the multiple amplifiers include multiple video amplifiers.

7. The apparatus of claim 1 wherein the amplifier includes a video amplifier.

8. The apparatus of claim 1 wherein the processor includes a processor for controlling the at least one switch for providing a known charge to the integrator and for controlling the A/D converter to A/D convert an integrator output before and after the introduction of the charge.

9. The apparatus of claim 8 further including a time base generator coupled to the processor, the processor including a processor for periodically operating the at least one switch for periodically uncoupling the input signal from the integrator, periodically coupling the reference source to the integrator, and periodically providing a known charge to the integrator, the A/D converter including an A/D converter for A/D converting the integrator output before and after a periodic introduction of the charge.

10. The apparatus of claim 9 wherein the integrator including a capacitance and an amplifier includes a first integrator including a first capacitance and a first amplifier and a second integrator including a second capacitance and a second amplifier, the first and second capacitances being so oriented in the apparatus that their temperatures remain substantially the same during operation of the apparatus, the processor including a processor for determining from the A/D converted first integrator output before and after the introduction of the charge the effective capacitance of the first integrator and A/D converter combination and concluding that changes in the effective capacitance of the second integrator are comparable.

11. The apparatus of claim 8 wherein the processor includes a processor for determining from the A/D converted integrator output before and after the introduction of the charge an effective capacitance of the integrator and A/D converter combination.

12. The apparatus of claim 11 wherein a temperature coefficient of the capacitance is known, the processor including a processor for determining from the change in the effective capacitance of the capacitance and the temperature coefficient of the capacitance the temperature of the capacitance.

13. The apparatus of claim 11 wherein the integrator including a capacitance and an amplifier includes a first integrator including a first capacitance and a first amplifier and a second integrator including a second capacitance and a second amplifier, the first and second capacitances being so oriented in the apparatus that their temperatures remain substantially the same during operation of the apparatus, the processor including a processor for determining from the A/D converted first integrator output before and after the introduction of the charge the effective capacitance of the first integrator and A/D converter combination and concluding that changes in the effective capacitance of the second integrator are comparable.

14. The apparatus of claim 8 wherein the integrator including a capacitance and an amplifier includes a first integrator including a first capacitance and a first amplifier and a second integrator including a second capacitance and a second amplifier, the first and second capacitances being so oriented in the apparatus that their temperatures remain substantially the same during operation of the apparatus, the processor including a processor for determining from the A/D converted first integrator output before and after the introduction of the charge the effective capacitance of the first integrator and A/D converter combination and concluding that changes in the effective capacitance of the second integrator are comparable.

15. The apparatus of claim 1 wherein the reference source includes a first reference source and a second reference source, the at least one switch including at least a first switch for selectively uncoupling the input signal from the integrator and coupling the first reference source to the integrator and at least a second switch for selectively coupling the second reference source to the integrator, the processor including a processor for controlling the at least first switch for providing a first charge to the integrator, controlling the A/D converter to A/D convert the integrator output after the introduction of the first charge, controlling the at least second switch for removing a second charge calculated to be equal to the first charge, and controlling the A/D converter to A/D convert the integrator output after the removal of the second charge.

16. The apparatus of claim 1 wherein the at least one switch further includes at least a first switch for selectively uncoupling the input signal from the integrator and discharging the integrator, the processor including a processor for controlling the A/D converter to A/D convert the integrator output after the integrator is discharged and for calculating an amplifier bias current from the output of the A/D converter after the integrator has been discharged.

17. The apparatus of claim 1 including a time base generator coupled to the processor, the processor further including a processor for controlling the A/D converter to A/D convert the integrator output after the integrator capacitor is charged to determine leakage from the integrator capacitor.

18. The apparatus of claim 1 wherein the processor includes a processor for controlling the at least one switch for providing a known charge to the integrator, the processor further controlling the A/D converter to A/D convert the integrator output before and after the introduction of the charge, the processor including a table of values to compensate the A/D converted integrator output by a difference between the A/D converted integrator output and the known charge.

19. The apparatus of claim 1 wherein the processor includes a processor for operating the at least one switch a lesser number of times to charge the capacitance to a calculated value, the A/D converter including an A/D converter for A/D converting a first output of the integrator, the processor including a processor for operating the at least one switch a greater number of times to charge the capacitance to the calculated value, the A/D converter including an A/D converter for A/D converting a second output of the integrator, the processor including a processor for determining a difference between the A/D converted first output and the A/D converted second output, dividing the difference between the A/D converted first output and the A/D converted second output by the difference between the greater number and the lesser number, and storing the quotient.

20. The apparatus of claim 19 wherein the processor for operating the at least one switch the lesser number of times to charge the capacitance to the calculated value includes a processor for operating the at least one switch once to charge the capacitance to the calculated value.

21. The apparatus of claim 19 wherein the processor for operating the at least one switch the greater number of times to charge the capacitance to the calculated value includes a processor for operating the at least one switch the greater number of times which is at least one hundred times the lesser number of times.

22. The apparatus of claim 1 wherein the reference source includes a first reference source for changing the amount of charge stored in the capacitance at a first known time rate and a second reference source for changing the amount of charge stored in the capacitance at a second known time rate, the at least one switch selectively coupling the first reference source to the integrator to charge the capacitance a first known amount and uncoupling the second reference source from the integrator and uncoupling the first reference source from the integrator and coupling the second reference source to the integrator to charge the capacitance a second known amount, the processor including a processor for comparing the first and second known amounts to calibrate the second reference source to the first reference source.

23. The apparatus of claim 22 wherein the first reference source has a first polarity, and the second reference source has a second and opposite polarity, charging the capacitance the second known amount including discharging the capacitance from the first known amount.

24. The apparatus of claim 1 wherein the integrator is a first integrator, the first integrator including a first capacitance and a first amplifier, the first capacitance coupled to an input port of the first amplifier, the A/D converter is a first A/D converter, the circuit further including a second integrator including a second capacitance and a second amplifier, the second capacitance coupled to an input port of the second amplifier, and a second A/D converter, the at least one switch selectively coupling the reference source to the first integrator or to the second integrator, the processor for controlling an A/D conversion cycle of the A/D converter including a processor for controlling the at least one switch and for controlling a first A/D conversion cycle of the first A/D converter for producing a first A/D converter output and for controlling a second A/D conversion cycle of the second A/D converter for producing a second A/D converter output.

25. The apparatus of claim 1 wherein the input signal is an input current signal and the reference source includes a current reference source.

26. The apparatus of claim 1 wherein the input signal is an input voltage signal, and further including a second amplifier and a resistance for converting the input voltage signal to an equivalent input current signal.

27. The apparatus of claim 26 wherein the reference source includes a first voltage reference source for changing the amount of charge stored in the capacitance at a first known time rate and a second voltage reference source for changing the amount of charge stored in the capacitance at a second known time rate, the at least one switch selectively coupling the first voltage reference source to the integrator to charge the capacitance a first known amount and uncoupling the second voltage reference source from the integrator, and uncoupling the first voltage reference source from the integrator and coupling the second voltage reference source to the integrator to charge the capacitance a second known amount.

28. The apparatus of claim 27 wherein the second amplifier and resistance for converting the input voltage signal to an equivalent input current signal includes a second amplifier and first resistance for converting one of the input voltage signal, the first voltage reference source and the second voltage reference source to a first equivalent input current signal, and a third amplifier and second resistance for converting one of the input voltage signal, the first voltage reference source and the second voltage reference source to a second equivalent input current signal, the processor for controlling an A/D conversion cycle of the A/D converter including a processor for alternately coupling said one of the input voltage signal, the first voltage reference source and the second voltage reference source alternately through the second amplifier to produce a first A/D converter output and through the third amplifier to produce a second A/D converter output, and averaging the first A/D converter output and the second A/D converter output.

29. The apparatus of claim 28 wherein the first reference source has a first polarity, and the second reference source has a second and opposite polarity, charging the capacitance the second known amount including discharging the capacitance from the first known amount.

30. The apparatus of claim 28 wherein the at least one switch includes at least a first switch having a position in which no input signal is present, the processor including a processor for storing A/D converter output when the at least first switch is in the position in which no input signal is present.

31. The apparatus of claim 27 wherein the first reference source has a first polarity, and the second reference source has a second and opposite polarity, charging the capacitance a second known amount including discharging the capacitance from the first known amount.

32. The apparatus of claim 26 wherein the at least one switch includes a first switch for alternately coupling the reference source and the input signal to the second amplifier and a second switch for alternately coupling and uncoupling the second amplifier to the capacitance, the second switch having a second resistance, the apparatus further including a negative resistance device having a second resistance, the magnitude of which is substantially a magnitude of the first resistance, for coupling in circuit with the first resistance.

33. The apparatus of claim 1 wherein the at least one switch includes at least a first switch having a position in which no input signal is present, the processor including a processor for storing A/D converter output when the at least first switch is in the position in which no input signal is present.

34. The apparatus of claim 1 further including a power supply for providing power for at least one of the integrator, the A/D converter, the reference source, the switch, and the processor, the power supply generating periodic signals during its operation, the processor including a processor for synchronizing the A/D conversion cycle and the periodic signals so that the effect of the periodic signals on the A/D converter output is substantially constant.

35. The apparatus of claim 1 wherein the processor for controlling the A/D conversion cycle of the A/D converter includes a processor for adjusting the A/D converter output during an A/D conversion cycle by an amount related to the A/D converter output during at least one preceding A/D conversion cycle and the A/D converter output during at least one succeeding A/D conversion cycle.

36. The apparatus of claim 35 wherein the processor includes a processor for adjusting the A/D converter output during an A/D conversion cycle by the amount related to the A/D converter output during at least the immediately preceding A/D conversion cycle and the A/D converter output during at least the immediately succeeding A/D conversion cycle.

37. The apparatus of claim 35 wherein the processor includes a processor for adjusting the A/D converter output during the A/D conversion cycle by an amount related to the A/D converter output during at least the two immediately preceding A/D conversion cycles and the A/D converter output during at least the two immediately succeeding A/D conversion cycles.

38. A circuit for analog-to-digital (A/D) conversion of an input signal, the circuit including an integrator, the integrator including a capacitance and an amplifier, the capacitance coupled to an input port of the amplifier, an A/D converter coupled to an output port of the amplifier, a reference source for changing an amount of charge stored in the capacitance at a known time rate, and a processor for controlling an A/D conversion cycle of the A/D converter, the input signal having a first polarity, and the reference source having a second and opposite polarity, the capacitance being simultaneously charged and discharged by the input signal and the reference source prior to each A/D conversion cycle.

39. The apparatus of claim 38 further including at least one switch, wherein the reference source includes a first reference source for changing the amount of charge stored in the capacitance at a first known time rate and a second reference source for changing the amount of charge stored in the capacitance at a second known time rate, at least one switch selectively coupling the first reference source to the integrator to change the amount of charge stored in the capacitance at the first known time rate, coupling the second reference source to the integrator to change the amount of charge stored in the capacitance at the second known time rate, and coupling both the first and second reference sources to the integrator to change the amount of charge stored in the capacitance at the algebraic sum of the first known time rate and the second known time rate.

40. The apparatus of claim 39 wherein the processor includes a processor for controlling the at least one switch to couple the first reference source to the integrator, or to couple the second reference source to the integrator, or to couple both the first and second reference sources to the integrator based upon the A/D converter output during a preceding A/D conversion cycle.

41. A method for analog-to-digital (A/D) conversion of an input signal, the method including providing an integrator including a capacitance coupled to an input port of an amplifier, coupling an A/D converter to an output port of the amplifier, changing an amount of charge stored in the capacitance at a known time rate by alternately coupling the input signal and a reference source to the capacitance through at least one switch, and controlling an A/D conversion cycle of the A/D converter and the at least one switch for controlling the coupling of the input signal and the reference source to the capacitance with a processor.

42. The method of claim 41 further including summing outputs from the A/D converter during successive cycles and dividing a sum of the outputs from the A/D converter by the number of summed outputs.

43. The method of claim 42 wherein summing outputs from the A/D converter during successive cycles and dividing by the number of summed outputs includes summing outputs from two consecutive cycles and dividing by two.

44. The method of claim 42 wherein summing outputs from the A/D converter during successive cycles and dividing by the number of summed outputs includes summing outputs from four consecutive readings and dividing by four.

45. The method of claim 41 wherein providing an integrator including a capacitance coupled to an input port of an amplifier includes providing multiple amplifiers in cascade configuration.

46. The method of claim 45 wherein providing multiple amplifiers includes providing multiple video amplifiers.

47. The method of claim 41 wherein providing an integrator including a capacitance coupled to an input port of an amplifier includes providing a video amplifier.

48. The method of claim 41 wherein controlling the at least one switch includes controlling the at least one switch for providing a known charge to the integrator and controlling the A/D conversion cycle includes controlling the A/D conversion cycle to A/D convert the integrator output before and after the introduction of the charge.

49. The method of claim 48 further including periodically operating the at least one switch for periodically uncoupling the input signal from the integrator, periodically coupling the reference source to the integrator, and periodically providing a known charge to the integrator, coupling an A/D converter to the integrator output including A/D converting the integrator output before and after the periodic introduction of the charge.

50. The method of claim 49 wherein providing an integrator including a capacitance coupled to an input port of an amplifier includes providing a first integrator including a first capacitance coupled to an input port of a first amplifier and providing a second integrator including a second capacitance so oriented that its temperature remains substantially the same as the temperature of the first capacitance during performance of the method, the second capacitance coupled to an input port of a second amplifier, determining from the A/D converted integrator output before and after the introduction of the charge the effective capacitance of the integrator and A/D converter combination including determining from the A/D converted first integrator output before and after the introduction of the charge the effective capacitance of the first integrator and A/D converter combination and concluding that changes in the effective capacitance of the second integrator are comparable.

51. The method of claim 48 wherein controlling an A/D conversion cycle of the A/D converter and the at least one switch for controlling the coupling of the input signal and the reference source to the capacitance with a processor includes determining from the A/D converted integrator output before and after the introduction of the charge the effective capacitance of the integrator and A/D converter combination.

52. The method of claim 51 wherein providing an integrator including a capacitance includes providing a capacitance, the temperature coefficient of which is known, the method further including determining from the change in the effective capacitance of the capacitance and the temperature coefficient of the capacitance the temperature of the capacitance.

53. The method of claim 48 wherein providing an integrator including a capacitance coupled to an input port of an amplifier includes providing a first integrator including a first capacitance coupled to an input port of a first amplifier and providing a second integrator including a second capacitance so oriented that its temperature remains substantially the same as the temperature of the first capacitance during performance of the method, the second capacitance coupled to an input port of a second amplifier, determining from the A/D converted integrator output before and after the introduction of the charge the effective capacitance of the integrator and A/D converter combination including determining from the A/D converted first integrator output before and after the introduction of the charge the effective capacitance of the first integrator and A/D converter combination and concluding that changes in the effective capacitance of the second integrator are comparable.

54. The method of claim 51 wherein providing an integrator including a capacitance coupled to an input port of an amplifier includes providing a first integrator including a first capacitance coupled to an input port of a first amplifier and providing a second integrator including a second capacitance so oriented that its temperature remains substantially the same as the temperature of the first capacitance during performance of the method, the second capacitance coupled to an input port of a second amplifier, determining from the A/D converted integrator output before and after the introduction of the charge the effective capacitance of the integrator and A/D converter combination including determining from the A/D converted first integrator output before and after the introduction of the charge the effective capacitance of the first integrator and A/D converter combination and concluding that changes in the effective capacitance of the second integrator are comparable.

55. The method of claim 41 wherein alternately coupling the reference source to the capacitance through at least a first switch includes alternately coupling a first reference source through at least a first switch for selectively uncoupling the input signal from the integrator and coupling the first reference source to the integrator and alternately coupling a second reference source through at least a second switch for selectively coupling the second reference source to the integrator, controlling the at least first switch for providing a first charge to the integrator, controlling the A/D converter to A/D convert the integrator output after the introduction of the first charge, controlling the at least second switch for removing a second charge calculated to be equal to the first charge, and controlling the A/D converter to A/D convert the integrator output after the removal of the second charge to provide an offset voltage of the integrator and the A/D converter.

56. The method of claim 41 wherein alternately coupling the input signal and the reference source to the capacitance through at least one switch includes selectively uncoupling the input signal from the integrator and discharging the integrator, controlling an A/D conversion cycle of the A/D converter and the at least one switch for controlling the coupling of the input signal and the reference source to the capacitance with a processor including controlling the A/D converter to A/D convert the integrator output after the integrator is discharged and calculating the amplifier bias current from the output of the A/D converter after the integrator has been discharged.

57. The method of claim 41 including controlling the A/D converter to A/D convert the integrator output after the integrator capacitor is charged.

58. The method of claim 39 including controlling the at least one switch for providing a known charge to the integrator, controlling the A/D converter to A/D convert the integrator output before and after the introduction of the charge, and providing the processor a table of values to compensate the A/D converted integrator output by the difference between the A/D converted integrator output and the known charge.

59. The method of claim 41 including operating the at least one switch a lesser number of times to charge the capacitance to a calculated value and A/D converting a first output of the integrator, operating the at least one switch a greater number of times to charge the capacitance to the calculated value and A/D converting a second output of the integrator, determining a difference between the A/D converted first output and the A/D converted second output, dividing the difference between the A/D converted first output and the A/D converted second output by the difference between the greater number and the lesser number, and storing the quotient.

60. The method of claim 59 wherein operating the at least one switch a lesser number of times to charge the capacitance to the calculated value includes operating the at least one switch once to charge the capacitance to the calculated value.

61. The method of claim 59 wherein operating the at least one switch a greater number of times to charge the capacitance to the calculated value includes operating the at least one switch at least about one hundred times the lesser number of times.

62. The method of claim 41 wherein coupling a reference source to the capacitance through at least one switch includes changing the amount of charge stored in the capacitance at a first known time rate by coupling a first reference source to the capacitance and changing the amount of charge stored in the capacitance at a second known time rate by coupling a second reference source to the capacitance, the at least a first switch selectively coupling the first reference source to the integrator to charge the capacitance a first known amount and uncoupling the second reference source from the integrator and uncoupling the first reference source from the integrator and coupling the second reference source to the integrator to charge the capacitance a second known amount, and comparing the first and second known amounts to calibrate the second reference source to the first reference source.

63. The method of claim 62 wherein coupling a first reference source to the capacitance includes coupling a first reference source having a first polarity to the capacitance, and coupling a second reference source to the capacitance includes coupling a second reference source having a second and opposite polarity to the capacitance, charging the capacitance the second known amount including discharging the capacitance from the first known amount.

64. The method of claim 41 wherein providing an integrator including a capacitance coupled to an input port of an amplifier includes providing a first integrator including a first amplifier and a first capacitance coupled to an input port of the first amplifier, providing a second integrator including a second amplifier and a second capacitance coupled to an input port of the second amplifier, coupling an A/D converter to an output port of the amplifier includes coupling a first A/D converter to an output port of the first amplifier, coupling a second A/D converter to an output port of the second amplifier, alternately coupling the input signal and a reference source to the capacitance through at least one switch includes selectively coupling the reference source to the first integrator or to the second integrator, and controlling an A/D conversion cycle of the A/D converter with the processor includes controlling a first A/D conversion cycle of the first A/D converter for producing a first A/D converter output and controlling a second A/D conversion cycle of the second A/D converter for producing a second A/D converter output.

65. The method of claim 41 wherein the input signal is an input current signal and alternately coupling the input current signal and a reference source to the capacitance includes alternately coupling the input current signal and a current reference source to the capacitance.

66. The method of claim 41 wherein the input signal is an input voltage signal, the method further including providing a second amplifier and a first resistance for converting the input voltage signal to an equivalent input current signal.

67. The method of claim 66 wherein alternately coupling the input signal and a reference source to the capacitance through at least one switch includes alternately coupling a first voltage reference source for changing the amount of charge stored in the capacitance at a first known time rate and a second voltage reference source for changing the amount of charge stored in the capacitance at a second known time rate, the at least first switch selectively coupling the first voltage reference source to the integrator to charge the capacitance a first known amount and uncoupling the second voltage reference source from the integrator, and uncoupling the first voltage reference source from the integrator and coupling the second voltage reference source to the integrator to charge the capacitance a second known amount.

68. The method of claim 67 wherein providing a second amplifier and a first resistance for converting the input voltage signal to an equivalent input current signal includes providing a second amplifier and first resistance for converting one of the input voltage signal, the first voltage reference source and the second voltage reference source to a first equivalent input current signal, and providing a third amplifier and second resistance for converting one of the input voltage signal, the first voltage reference source and the second voltage reference source to a second equivalent input current signal, controlling an A/D conversion cycle of the A/D converter and the at least one switch for controlling the coupling of the input signal and the reference source to the capacitance with a processor including alternately coupling said one of the input voltage signal, the first voltage reference source and the second voltage reference source alternately through the second amplifier to produce a first A/D converter output and the third amplifier to produce a second A/D converter output, and averaging the first A/D converter output and the second A/D converter output.

69. The method of claim 68 wherein alternately coupling a first voltage reference source for changing the amount of charge stored in the capacitance at a first known time rate and a second voltage reference source for changing the amount of charge stored in the capacitance at a second known time rate includes alternately coupling a first voltage reference source having a first polarity for changing the amount of charge stored in the capacitance at a first known time rate and a second voltage reference source having a second polarity opposite to the first polarity for changing the amount of charge stored in the capacitance at a second known time rate.

70. The method of claim 68 wherein alternately coupling the input signal and a reference source to the capacitance through at least one switch includes alternately coupling the input signal, a reference source and no input to the capacitance, and controlling an A/D conversion cycle of the A/D converter and the at least one switch for controlling the coupling of the input signal and the reference source to the capacitance with a processor includes controlling an A/D conversion cycle of the A/D converter and the at least one switch for controlling the coupling of the input signal, the reference source and no input to the capacitance and storing A/D converter output when the at least first switch is in the position in which no input is present.

71. The method of claim 67 wherein alternately coupling a first voltage reference source for changing the amount of charge stored in the capacitance at a first known time rate and a second voltage reference source for changing the amount of charge stored in the capacitance at a second known time rate includes alternately coupling a first voltage reference source having a first polarity for changing the amount of charge stored in the capacitance at a first known time rate and a second voltage reference source having a second polarity opposite to the first polarity for changing the amount of charge stored in the capacitance at a second known time rate.

72. The method of claim 66 wherein providing at least a first switch for alternately coupling the reference source and the input signal to the second amplifier includes providing at least a second switch for alternately coupling and uncoupling the second amplifier to the capacitance, the method further including providing a negative resistance device having a second resistance, the magnitude of which is substantially the magnitude of the first resistance for coupling in circuit with the first resistance.

73. The method of claim 41 wherein alternately coupling the input signal and a reference source to the capacitance through at least one switch includes alternately coupling the input signal, a reference source and no input to the capacitance, and controlling an A/D conversion cycle of the A/D converter and the at least one switch for controlling the coupling of the input signal and the reference source to the capacitance with a processor includes controlling an A/D conversion cycle of the A/D converter and the at least one switch for controlling the coupling of the input signal, the reference source and no input to the capacitance and storing A/D converter output when the at least first switch is in the position in which no input is present.

74. The method of claim 41 further including providing a power supply which generates periodic signals during its operation for at least one of the integrator, the A/D converter, the reference source, the switch, and the processor, controlling an A/D conversion cycle of the A/D converter including synchronizing the A/D conversion cycle and the periodic signals.

75. The method of claim 41 wherein controlling an A/D conversion cycle of the A/D converter includes adjusting the A/D converter output during an A/D conversion cycle by an amount related to the A/D converter output during at least one preceding A/D conversion cycle and the A/D converter output during at least one succeeding A/D conversion cycle.

76. The method of claim 75 wherein adjusting the A/D converter output during an A/D conversion cycle by an amount related to the A/D converter output during at least one preceding A/D conversion cycle and the A/D converter output during at least one succeeding A/D conversion cycle includes adjusting the A/D converter output during an A/D conversion cycle by an amount related to the A/D converter output during at least the immediately preceding A/D conversion cycle and the A/D converter output during at least the immediately succeeding A/D conversion cycle.

77. The method of claim 75 wherein adjusting the A/D converter output during an A/D conversion cycle by an amount related to the A/D converter output during at least one preceding A/D conversion cycle and the A/D converter output during at least one succeeding A/D conversion cycle includes adjusting the A/D converter output during an A/D conversion cycle by an amount related to the A/D converter output during at least the two immediately preceding A/D conversion cycles and the A/D converter output during at least the two immediately succeeding A/D conversion cycles.

78. A method of analog-to-digital (A/D) conversion of an input signal having a first polarity, the method including providing an integrator including a capacitance coupled to an input port of an amplifier, coupling an A/D converter to an output port of the amplifier, changing the amount of charge stored in the capacitance by coupling the input signal and a reference source having a second and opposite polarity to the capacitance, and controlling an A/D conversion cycle of the A/D converter to simultaneously charge and discharge the capacitance with the input signal and the reference source prior to each A/D conversion cycle.

79. The method of claim 78 wherein changing the amount of charge stored in the capacitance by coupling the input signal and a reference source having a second and opposite polarity to the capacitance includes selectively coupling a first reference source for changing the amount of charge stored in the capacitance at a first known time rate to the integrator to change the amount of charge stored in the capacitance at the first known time rate, coupling a second reference source for changing the amount of charge stored in the capacitance at a second known time rate to the integrator to change the amount of charge stored in the capacitance at the second known time rate, and coupling both the first and second reference sources to the integrator to change the amount of charge stored in the capacitance at the sum of the first known time rate and the second known time rate.

80. The method of claim 79 wherein selectively coupling the first reference source or the second reference source or both the first and second reference sources to the integrator includes controlling at least one switch to couple the first reference source to the integrator, or to couple the second reference source to the integrator, or to couple both the first and second reference sources to the integrator based upon the A/D converter output during a preceding A/D conversion cycle.

* * * * *